(12) United States Patent
Takada

(10) Patent No.: US 11,659,652 B2
(45) Date of Patent: May 23, 2023

(54) RESIN SUBSTRATE AND METHOD FOR MANUFACTURING RESIN SUBSTRATE

(71) Applicant: Murata Manufacturing Co., Ltd., Nagaokakyo (JP)

(72) Inventor: Ryosuke Takada, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 125 days.

(21) Appl. No.: 17/318,265

(22) Filed: May 12, 2021

(65) Prior Publication Data

US 2021/0267045 A1 Aug. 26, 2021

Related U.S. Application Data

(63) Continuation of application No. PCT/JP2019/046631, filed on Nov. 28, 2019.

(30) Foreign Application Priority Data

Nov. 29, 2018 (JP) .............................. JP2018-223384

(51) Int. Cl.
*H05K 1/02* (2006.01)
*H05K 1/03* (2006.01)
(Continued)

(52) U.S. Cl.
CPC ........... *H05K 1/028* (2013.01); *H05K 1/0353* (2013.01); *H05K 1/148* (2013.01); *H05K 3/4688* (2013.01);
(Continued)

(58) Field of Classification Search
CPC .... H05K 1/0277; H05K 1/028; H05K 1/0313; H05K 1/0353; H05K 1/393; H05K 1/148;
(Continued)

(56) References Cited

U.S. PATENT DOCUMENTS

2009/0107703 A1* 4/2009 Abe .................. H01L 23/49822
174/254
2010/0051327 A1 3/2010 Ogatsu
(Continued)

FOREIGN PATENT DOCUMENTS

JP 2011-176013 A 9/2011
JP 2014-090041 A 5/2014
(Continued)

OTHER PUBLICATIONS

Crystalline structure, Study.com, Oct. 11, 2021 (Year: 2021).*
(Continued)

*Primary Examiner* — Timothy J Thompson
*Assistant Examiner* — John B Freal
(74) *Attorney, Agent, or Firm* — Keating & Bennett, LLP

(57) ABSTRACT

A resin substrate includes an insulating base material including opposing first and second main surfaces, at least one of which is parallel or substantially parallel to each of an X-axis direction and a Y-axis direction. The insulating base material is divided into first and second sections arranged in the X-axis direction. The first section includes, when evenly divided into three in a Z-axis direction, a first region closest to the first main surface, a second region closest to the second main surface, and a third region between the first region and the second region. A degree of resin molecular orientation in the first region in the Y-axis direction is greater than a degree of resin molecular orientation in the second section of the insulating base material in the Y-axis direction.

29 Claims, 18 Drawing Sheets

(51) Int. Cl.
*H05K 1/14* (2006.01)
*H05K 3/46* (2006.01)
*H01R 12/62* (2011.01)

(52) U.S. Cl.
CPC ...... *H01R 12/62* (2013.01); *H05K 2201/0112* (2013.01); *H05K 2201/0129* (2013.01); *H05K 2201/0141* (2013.01); *H05K 2201/0154* (2013.01); *H05K 2201/0195* (2013.01); *H05K 2203/065* (2013.01); *H05K 2203/107* (2013.01)

(58) Field of Classification Search
CPC ... H05K 2201/0112; H05K 2201/0129; H05K 2201/0154; H05K 2201/0195; H05K 2203/065; H01R 12/62
See application file for complete search history.

(56) References Cited

U.S. PATENT DOCUMENTS

| | | |
|---|---|---|
| 2015/0305136 A1 | 10/2015 | Tachikawa |
| 2015/0373854 A1 | 12/2015 | Ikemoto et al. |

FOREIGN PATENT DOCUMENTS

| | | |
|---|---|---|
| WO | 2008/056500 A1 | 5/2008 |
| WO | 2014/174931 A1 | 10/2014 |

OTHER PUBLICATIONS

Omnexus, Dielectric Constant, 2022 (Year: 2022).*
Official Communication issued in International Patent Application No. PCT/JP2019/046631, dated Feb. 18, 2020.

* cited by examiner

Fig.3
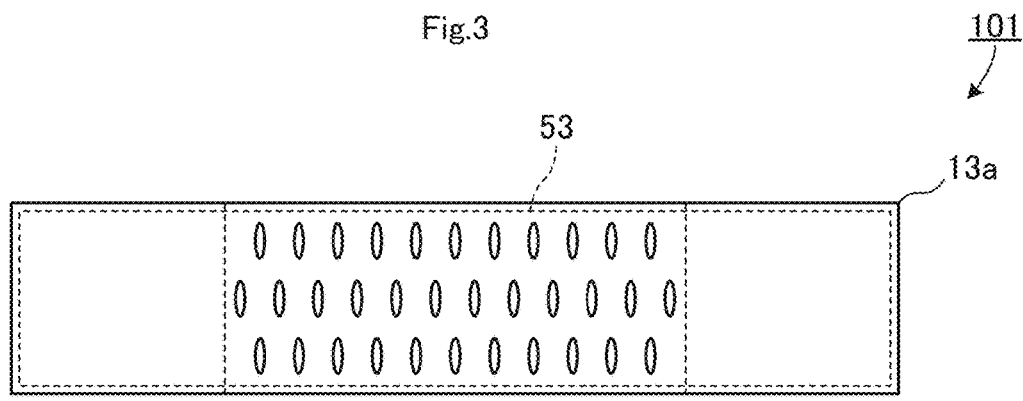
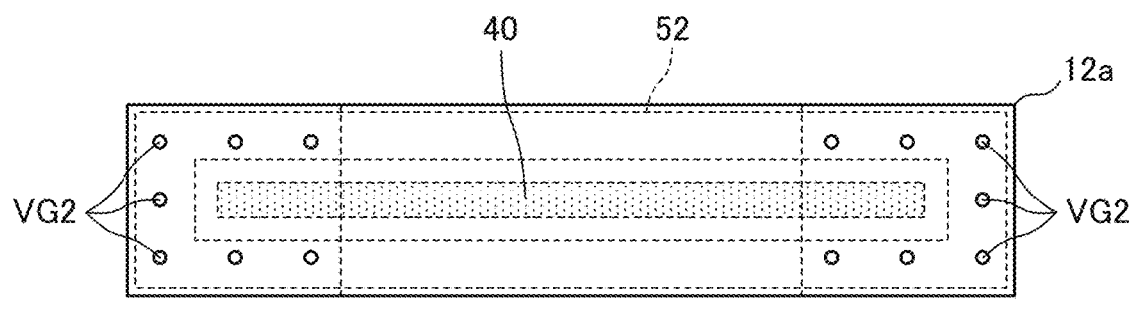
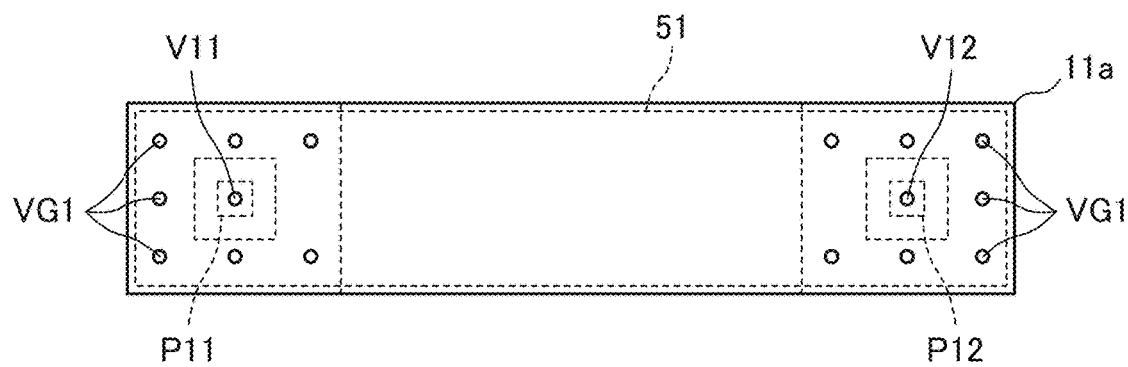
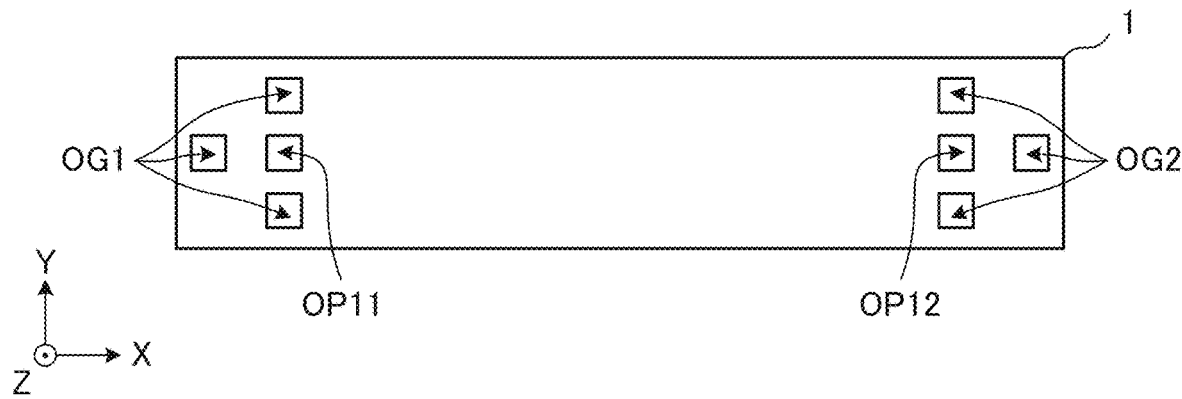

Fig.9
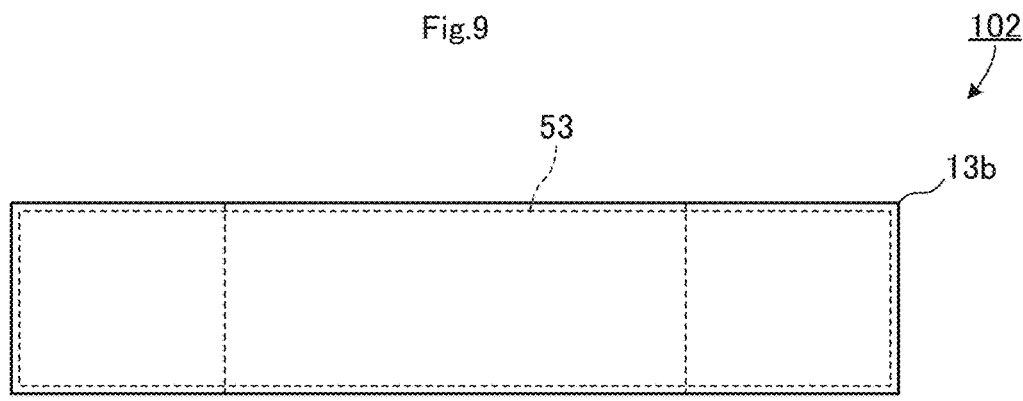
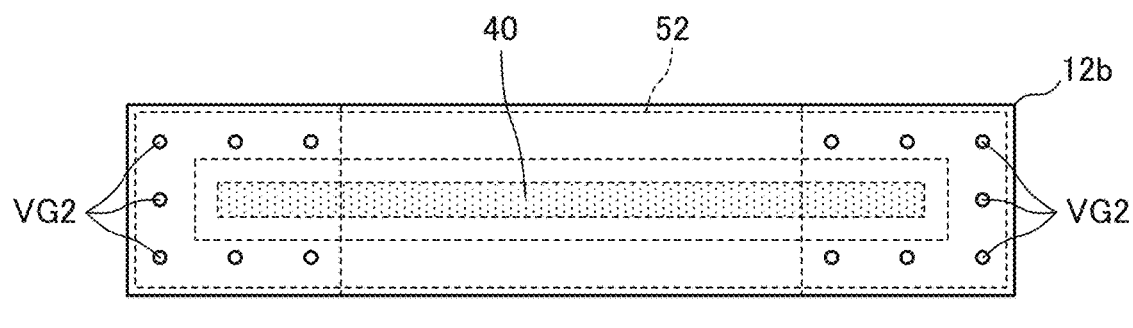
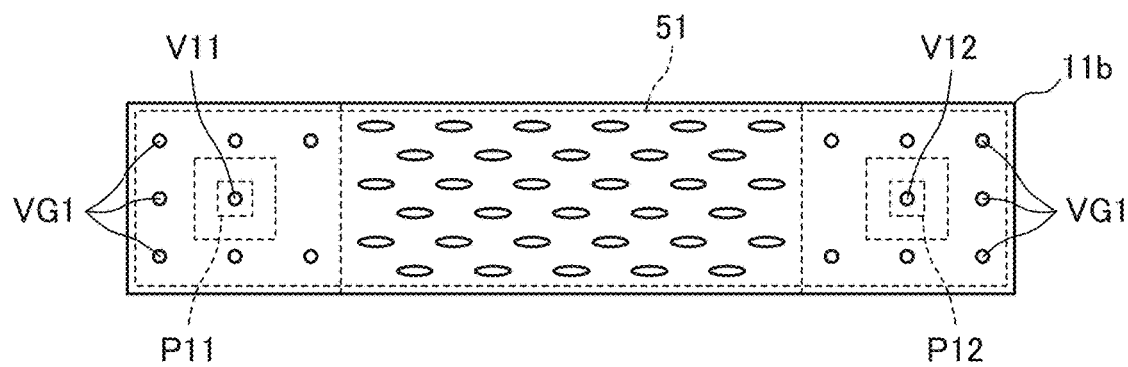
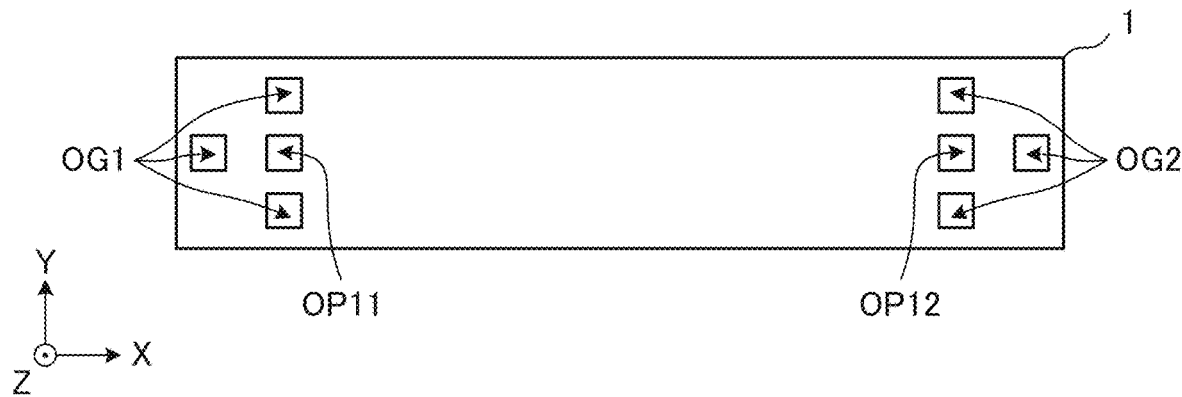

Fig.11
(1)
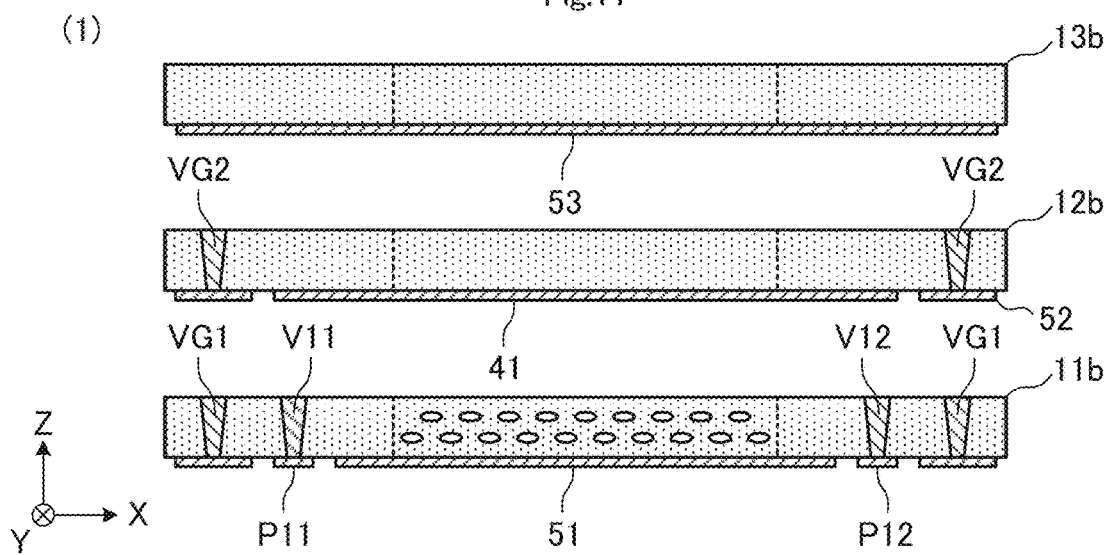
(2)
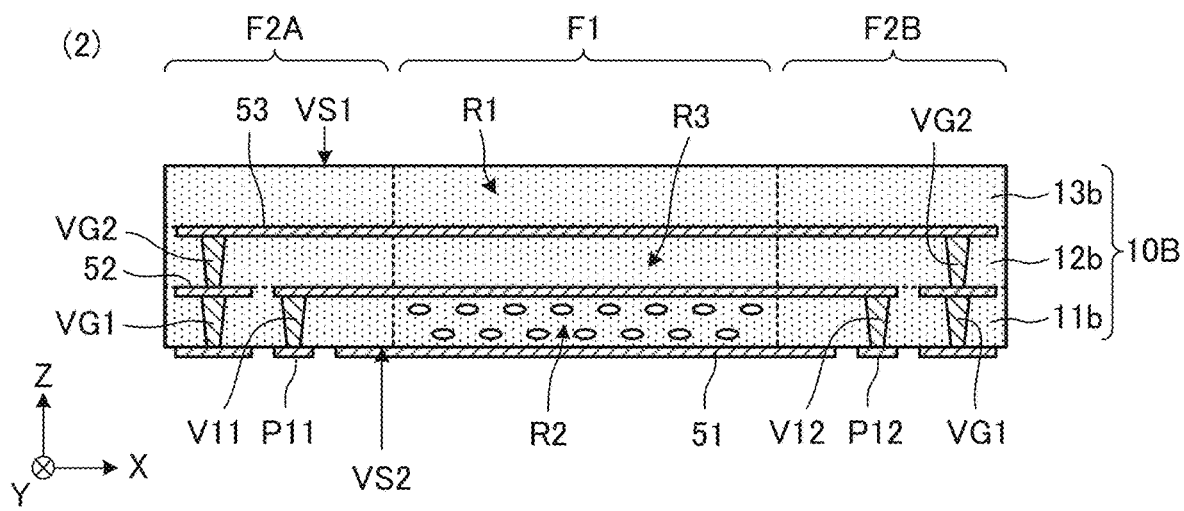
(3)
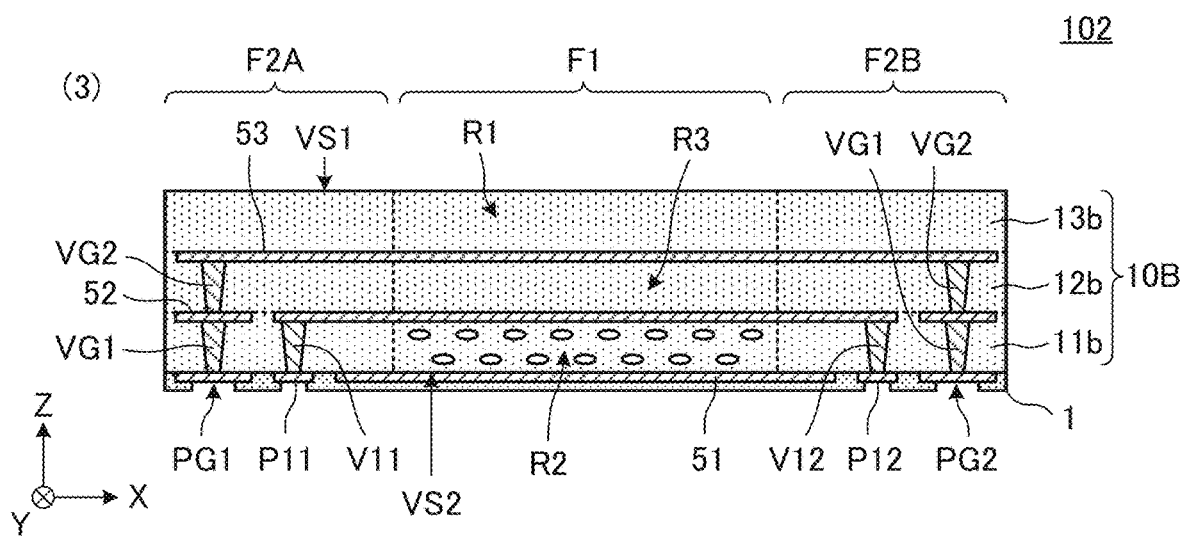

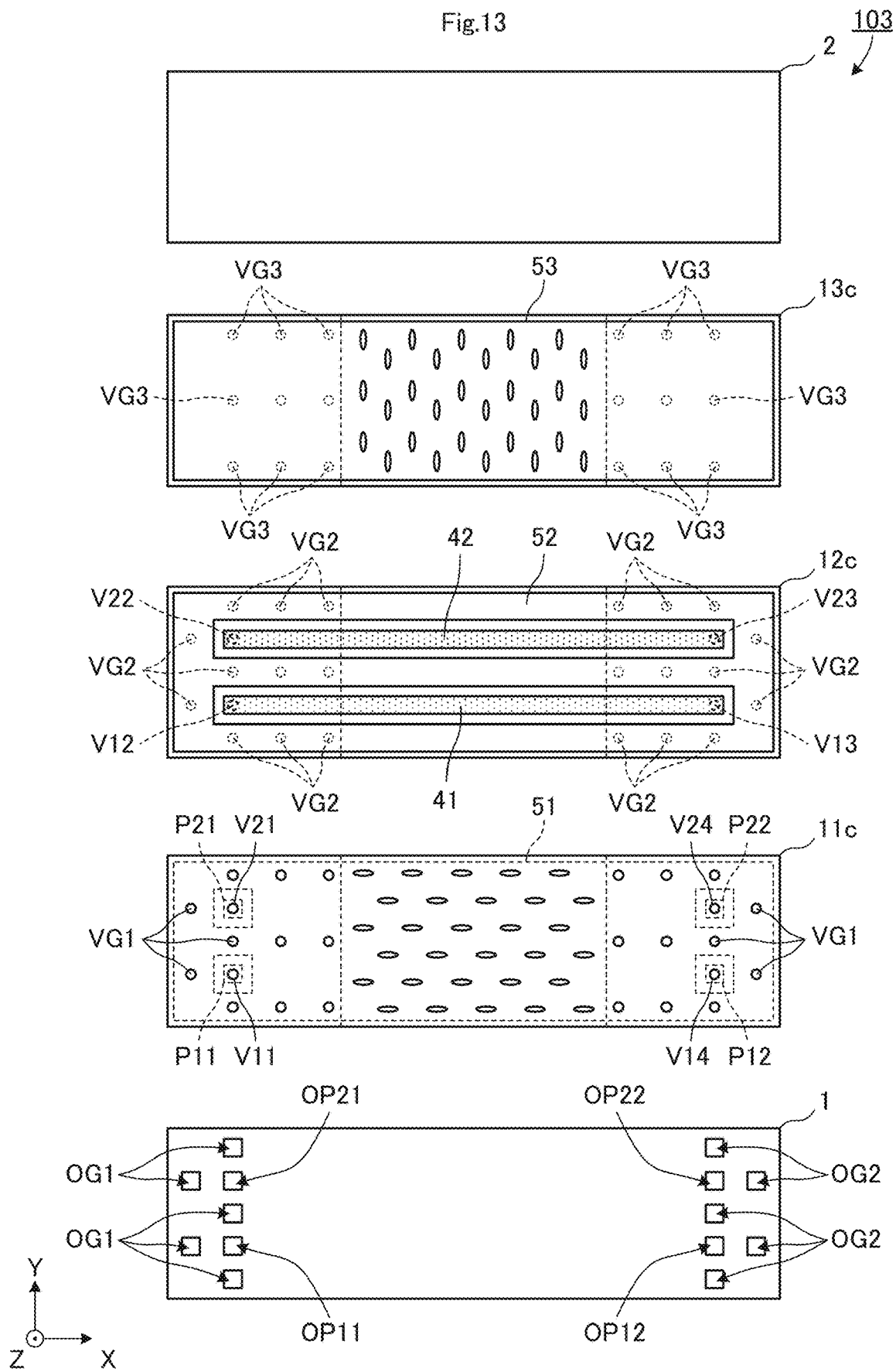

Fig.15
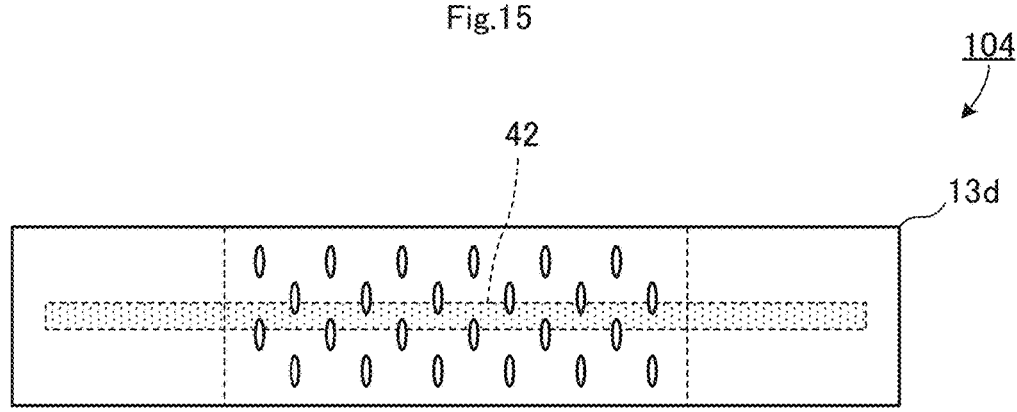
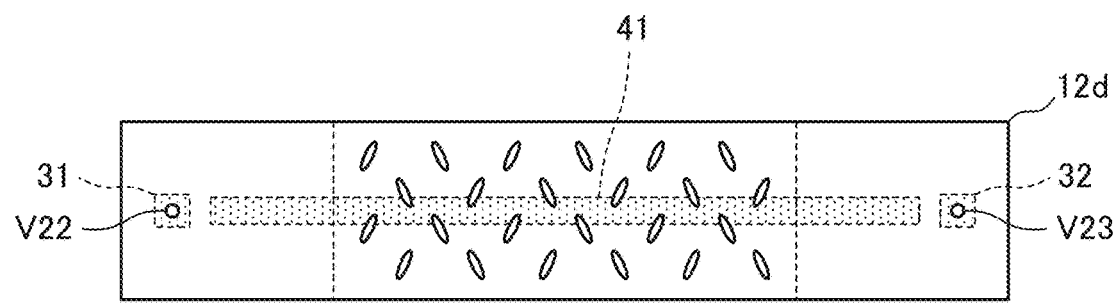
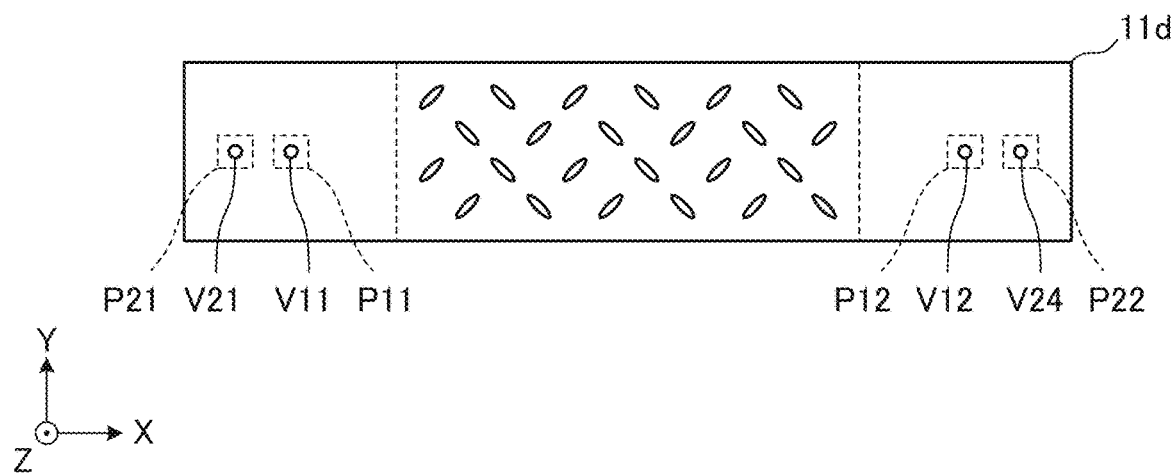

Fig.17
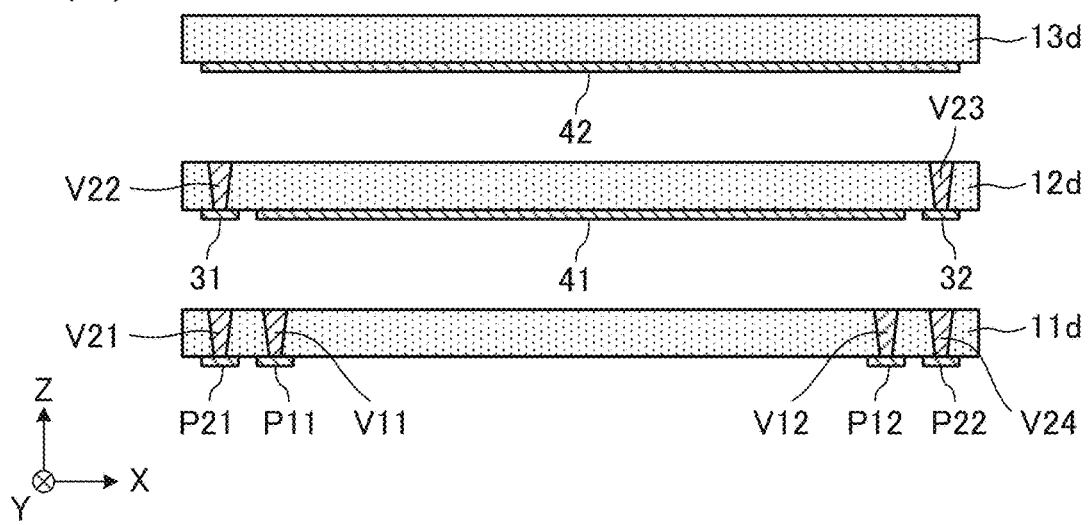
(1)
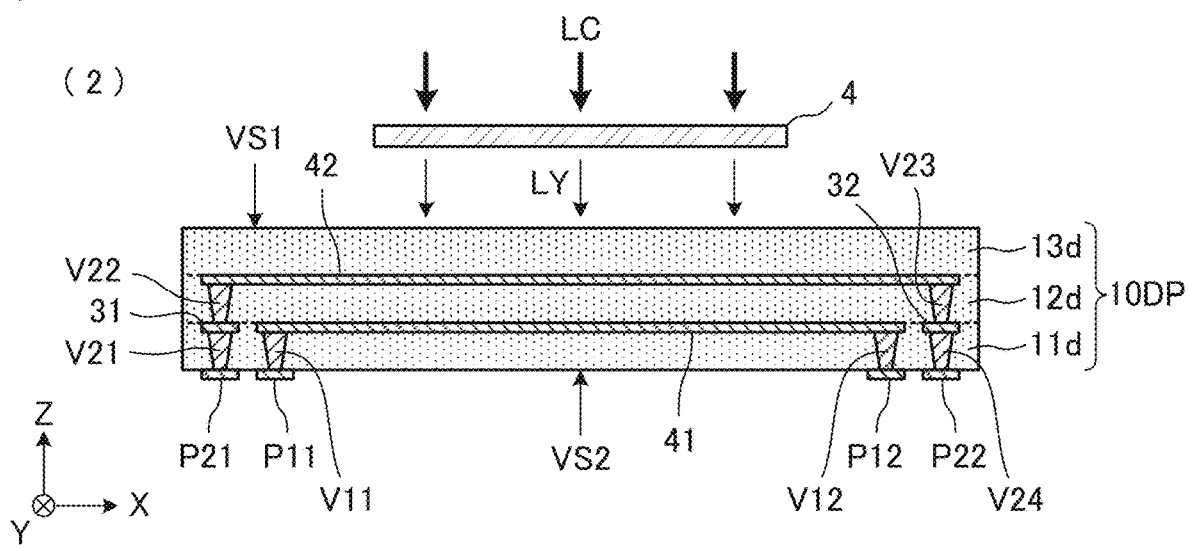
(2)
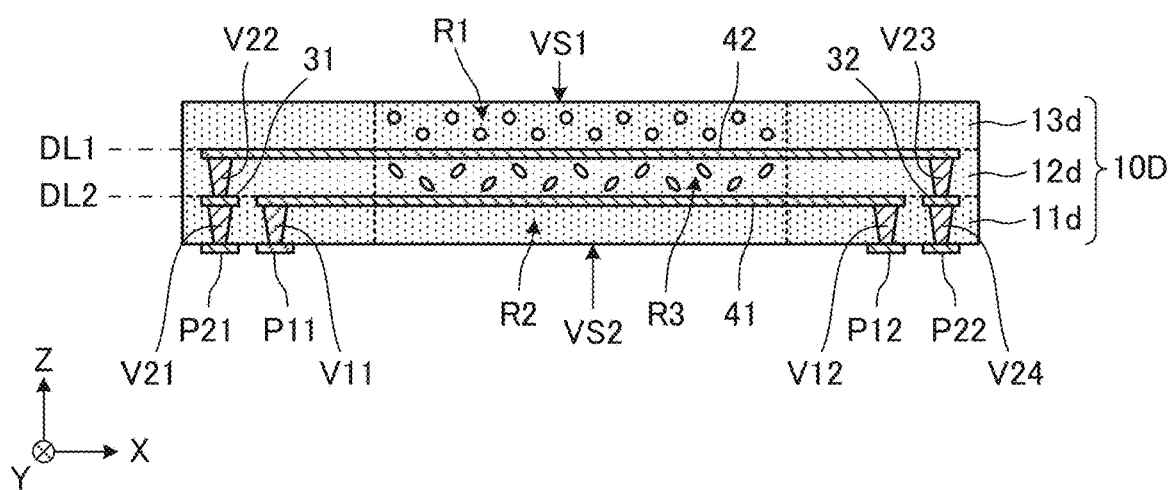
(3)

RESIN SUBSTRATE AND METHOD FOR MANUFACTURING RESIN SUBSTRATE

CROSS REFERENCE TO RELATED APPLICATIONS

This application claims the benefit of priority to Japanese Patent Application No. 2018-223384 filed on Nov. 29, 2018 and is a Continuation Application of PCT Application No. PCT/JP2019/046631 filed on Nov. 28, 2019. The entire contents of each application are hereby incorporated herein by reference.

BACKGROUND OF THE INVENTION

1. Field of the Invention

The present invention relates to a resin substrate, and more specifically, to a resin substrate including an insulating base material, and a method for manufacturing the resin substrate.

2. Description of the Related Art

Conventionally, a resin substrate formed of a material including a glass fiber impregnated with a resin is known. For example, WO 2008/056500 A discloses a resin substrate formed of a plurality of resin layers laminated on each other, and the plurality of resin layers include a glass fiber-reinforced resin layer where glass fibers are oriented in one direction. In the glass fiber-reinforced resin layer where the glass fibers are oriented in one direction, each of elastic modulus and linear expansion coefficient in the one direction is largely different from that in a direction orthogonal to the one direction. With the resin substrate described above, orientations of the glass fibers (included in the plurality of resin layers) may be combined such that the resin substrate is bent in a desirable direction.

However, in the resin substrate disclosed in WO 2008/056500 A, the glass fibers are included in an entire portion of the glass fiber-reinforced resin layer. Thus, when the resin substrate is formed to be easily bent in the desirable direction, the resin substrate hardly has a difference in physical properties between in a portion to be bent and in a portion not to be bent. With this configuration, the entire resin substrate is prone to be bent. In other words, the portions not to be bent, such as a connection section, are prone to be bent, so that the resin substrate is less mountable to a circuit board or other substrates.

SUMMARY OF THE INVENTION

Preferred embodiments of the present invention provide resin substrates that each include an insulating base material including a first section and a second section, each arranged in a surface direction, and in the substrate, even when the first section is bent, the second section is less prone to being deformed or bent.

A preferred embodiment of the present invention provides a resin substrate including an insulating base material including a first main surface and a second main surface at least one of which is parallel or substantially parallel to each of an X-axis direction and a Y-axis direction in an X-Y-Z orthogonal coordinate system, the first main surface and the second main surface opposing each other, wherein the insulating base material is divided into a first section and a second section each of which is arranged in the X-axis direction, the first section includes, when evenly divided into three in a Z-axis direction, a first region closest to the first main surface, a second region closest to the second main surface, and a third region located between the first region and the second region, and a degree of resin molecular orientation in the first region in the Y-axis direction is greater than a degree of resin molecular orientation in the second section of the insulating base material in the Y-axis direction.

When a resin element has resin molecules oriented in the Y-axis direction, the resin element has a greater Young's modulus in the Y-axis direction than a resin element having isotropic resin molecular orientation, and the resin element has a smaller Young's modulus in the X-axis direction than the resin element having the isotropic resin molecular orientation, the X-axis direction being orthogonal or substantially orthogonal to the Y-axis direction. With this configuration, the first region has a greater degree of resin molecular orientation in the Y-axis direction than the second section of the insulating base material. Accordingly, when the first section is bent, tensile stress is applied to the first region in the X-axis direction, so that the first region is subjected to more tensile deformation than the second section, and in the insulating base material, the first section is bent more easily in the X-axis direction than the second section.

Further, when the resin element includes the resin molecules oriented in the Y-axis direction, the resin element has a smaller linear expansion coefficient in the Y-axis direction and has a greater linear expansion coefficient in the X-axis direction orthogonal or substantially orthogonal to the Y-axis direction than the resin element having the isotropic resin molecular orientation. With this configuration, the first region has a greater linear expansion coefficient in the X-axis direction than the second section. Accordingly, when the insulating base material is heated (e.g., when the insulating base material is subjected to heating and bending), due to a difference in linear expansion coefficient in the Z-axis direction, the first section is bent more easily in the X-axis direction than the second section in the insulating base material.

A preferred embodiment of the present invention provides a resin substrate including an insulating base material including a first main surface and a second main surface at least one of which is parallel or substantially parallel to each of an X-axis direction and a Y-axis direction in an X-Y-Z orthogonal coordinate system, the first main surface and the second main surface opposing each other, wherein the insulating base material is divided into a first section and a second section each of which is arranged in the X-axis direction, the first section includes, when evenly divided into three in a Z-axis direction, a first region closest to the first main surface, a second region closest to the second main surface, and a third region located between the first region and the second region, and a degree of resin molecular orientation in the second region in the X-axis direction is greater than a degree of resin molecular orientation in the second section of the insulating base material in the X-axis direction.

With this configuration, when the first section is bent, compressive stress is applied to the second region in the X-axis direction, so that the second region is subjected to compressive deformation to a greater extent than the second section, and in the insulating base material, the first section is bent more easily than the second section.

Concurrently, with this configuration, when the resin substrate is heated, the first section is bent more easily than the second section in the insulating base material.

A preferred embodiment of the present invention provides a resin substrate including an insulating base material including a first main surface and a second main surface at least one of which is parallel or substantially parallel to each of an X-axis direction and a Y-axis direction in an X-Y-Z orthogonal coordinate system, the first main surface and the second main surface opposing each other, wherein the insulating base material is divided into a first section and a second section each of which is arranged in the X-axis direction, the first section includes, when evenly divided into three in a Z-axis direction, a first region closest to the first main surface, a second region closest to the second main surface, and a third region located between the first region and the second region, a Young's modulus in the first region in the Y-axis direction is greater than a Young's modulus in the second section in the Y-axis direction, and a Young's modulus in the first region in the X-axis direction is smaller than a Young's modulus in the second section in the X-axis direction.

With this configuration, when the first section is bent, tensile stress is applied to the first region in the X-axis direction, so that the first region is subjected to tensile deformation more than the second section, and in the insulating base material, the first section is bent more easily in the X-axis direction than the second section.

A preferred embodiment of the present invention provides a resin substrate including an insulating base material including a first main surface and a second main surface at least one of which is parallel or substantially parallel to each of an X-axis direction and a Y-axis direction in an X-Y-Z orthogonal coordinate system, the first main surface and the second main surface opposing each other, wherein the insulating base material is divided into a first section and a second section each of which is arranged in the X-axis direction, the first section includes, when evenly divided into three in a Z-axis direction, a first region closest to the first main surface, a second region closest to the second main surface, and a third region located between the first region and the second region, a Young's modulus in the second region in the X-axis direction is greater than a Young's modulus in the second section in the X-axis direction, and a Young's modulus in the second region in the Y-axis direction is smaller than a Young's modulus in the second section in the Y-axis direction.

With this configuration, when the first section is bent, compressive stress is applied to the second region in the X-axis direction, so that the second region is subjected to compressive deformation more than the second section, and in the insulating base material, the first section is bent more easily than the second section.

A preferred embodiment of the present invention provides a resin substrate including an insulating base material including a first main surface and a second main surface at least one of which is parallel or substantially parallel to each of an X-axis direction and a Y-axis direction in an X-Y-Z orthogonal coordinate system, the first main surface and the second main surface opposing each other, wherein the insulating base material is divided into a first section, a second section, and a third section each of which is arranged in the X-axis direction, the first section includes, when evenly divided into three in a Z-axis direction, a first region closest to the first main surface, a second region positioned to the second main surface, and a third region located between the first region and the second region, the third section includes, when evenly divided into three in the Z-axis direction, a first region closest to the first main surface, a second region closest to the second main surface, and a third region located between the first region and the second region, a degree of resin molecular orientation in the first region of the first section in the Y-axis direction is greater than a degree of resin molecular orientation in the second section of the insulating base material in the Y-axis direction, and a degree of resin molecular orientation in the second region of the third section in the Y-axis direction is greater than the degree of resin molecular orientation in the second section of the insulating base material in the Y-axis direction.

A preferred embodiment of the present invention provides a resin substrate including an insulating base material including a first main surface and a second main surface at least one of which is parallel or substantially parallel to each of an X-axis direction and a Y-axis direction in an X-Y-Z orthogonal coordinate system, the first main surface and the second main surface opposing each other, wherein the insulating base material is divided into a first section, a second section, and a third section each of which is arranged in the X-axis direction, the first section includes, when evenly divided into three in a Z-axis direction, a first region closest to the first main surface, a second region closest to the second main surface, and a third region located between the first region and the second region, the third section includes, when evenly divided into three in the Z-axis direction, a first region closest to the first main surface, a second region closest to the second main surface, and a third region located between the first region and the second region, a degree of resin molecular orientation in the second region of the first section in the X-axis direction is greater than a degree of resin molecular orientation in the second section of the insulating base material in the X-axis direction, and a degree of resin molecular orientation in the first region of the third section in the X-axis direction is greater than the degree of resin molecular orientation in the second section of the insulating base material in the X-axis direction.

When the resin substrate includes a portion that is to be bent in a direction reverse to that of the first section, the resin substrate may further include the third section.

A preferred embodiment of the present invention provides a method for manufacturing a resin substrate, the resin substrate including an insulating base material including a first main surface and a second main surface at least one of which is parallel or substantially parallel to each of an X-axis direction and a Y-axis direction in an X-Y-Z orthogonal coordinate system, the first main surface and the second main surface opposing each other, the insulating base material divided into a first section and a second section each of which is arranged in the X-axis direction, the first section including, when evenly divided into three in a Z-axis direction, a first region closest to the first main surface, a second region closest to the second main surface, and a third region located between the first region and the second region, the method including a first molecular orientation step of irradiating a portion in a resin layer, the portion to be the first region of the insulating base material, with a light beam or a laser beam, in order to orient resin molecules of the portion in the Y-axis direction, and a first insulating base material formation step of, when the first molecular orientation step has been completed, laminating a plurality of resin layers including the resin layer where the resin molecules of the portion have been oriented in the Y-axis direction, and heat-pressing the plurality of resin layers, in order to form the insulating base material, and in order to cause a degree of resin molecular orientation in the first region in the Y-axis direction to be greater than a degree of resin molecular orientation in the second section of the insulating base material in the Y-axis direction.

A preferred embodiment of the present invention provides a method for manufacturing a resin substrate, the resin substrate including an insulating base material including a first main surface and a second main surface at least one of which is parallel or substantially parallel to each of an X-axis direction and a Y-axis direction in an X-Y-Z orthogonal coordinate system, the first main surface and the second main surface opposing each other, the insulating base material divided into a first section and a second section each of which is arranged in the X-axis direction, the first section including, when evenly divided into three in a Z-axis direction, a first region closest to the first main surface, a second region closest to the second main surface, and a third region located between the first region and the second region, the method including a second molecular orientation step of irradiating a portion in a resin layer, the portion to be the second region of the insulating base material, with a light beam or a laser beam, in order to orient resin molecules of the portion in the X-axis direction; and a first insulating base material formation step of, when the second molecular orientation step has been completed, laminating a plurality of resin layers including the resin layer where the resin molecules of the portion have been oriented in the X-axis direction, and heat-pressing the plurality of resin layers, in order to form the insulating base material, and in order to cause a degree of resin molecular orientation in the second region in the X-axis direction to be greater than a degree of resin molecular orientation in the second section of the insulating base material in the X-axis direction.

A preferred embodiment of the present invention provides a method for manufacturing a resin substrate, the resin substrate including an insulating base material including a first main surface and a second main surface at least one of which is parallel or substantially parallel to each of an X-axis direction and a Y-axis direction in an X-Y-Z orthogonal coordinate system, the first main surface and the second main surface opposing each other, the insulating base material divided into a first section and a second section each of which is arranged in the X-axis direction, the first section including, when evenly divided into three in a Z-axis direction, a first region closest to the first main surface, a second region closest to the second main surface, and a third region located between the first region and the second region, the method including a second insulating base material formation step of forming the insulating base material; and a third molecular orientation step of, when the second insulating base material formation step has been completed, irradiating a portion to be the first region with a light beam or a laser beam from the first main surface, in order to cause a degree of resin molecular orientation in the first region in the Y-axis direction to be greater than a degree of resin molecular orientation the second section of the insulating base material in the Y-axis direction.

A preferred embodiment of the present invention provides a method for manufacturing a resin substrate, the resin substrate including an insulating base material including a first main surface and a second main surface at least one of which is parallel or substantially in parallel to each of an X-axis direction and a Y-axis direction in an X-Y-Z orthogonal coordinate system, the first main surface and the second main surface opposing each other, the insulating base material divided into a first section and a second section each of which is arranged in the X-axis direction, the first section including, when evenly divided into three in a Z-axis direction, a first region positioned to the first main surface, a second region closest to the second main surface, and a third region located between the first region and the second region, the method including a second insulating base material formation step of forming the insulating base material; and a fourth molecular orientation step of, when the second insulating base material formation step has been completed, irradiating a portion to be the second region with a light beam or a laser beam from the second main surface, in order to cause a degree of resin molecular orientation in the second region in the X-axis direction to be greater than a degree of resin molecular orientation in the second section of the insulating base material in the X-axis direction.

With these manufacturing methods described above, a resin substrate is easily manufactured to have a structure such that, even when a first section of an insulating base material is bent, a second section is less prone to being deformed.

Preferred embodiments of the present invention provide resin substrates that each include an insulating base material including a first section and a second section, each arranged in a surface direction, and in the substrate, even when the first section is bent, the second section is less prone to being deformed.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 3 is an exploded plan view of the resin substrate 101.

FIG. 9 is an exploded plan view of the resin substrate 102.

FIG. 11 is a cross-sectional view showing steps for manufacturing the resin substrate 102 in a sequential order.

FIG. 13 is an exploded plan view of the resin substrate 103.

FIG. 15 is an exploded plan view of the resin substrate 104.

FIG. 17 is a cross-sectional view showing steps for manufacturing the resin substrate 104 in a sequential order.

DETAILED DESCRIPTION OF THE PREFERRED EMBODIMENTS

Figure 1:
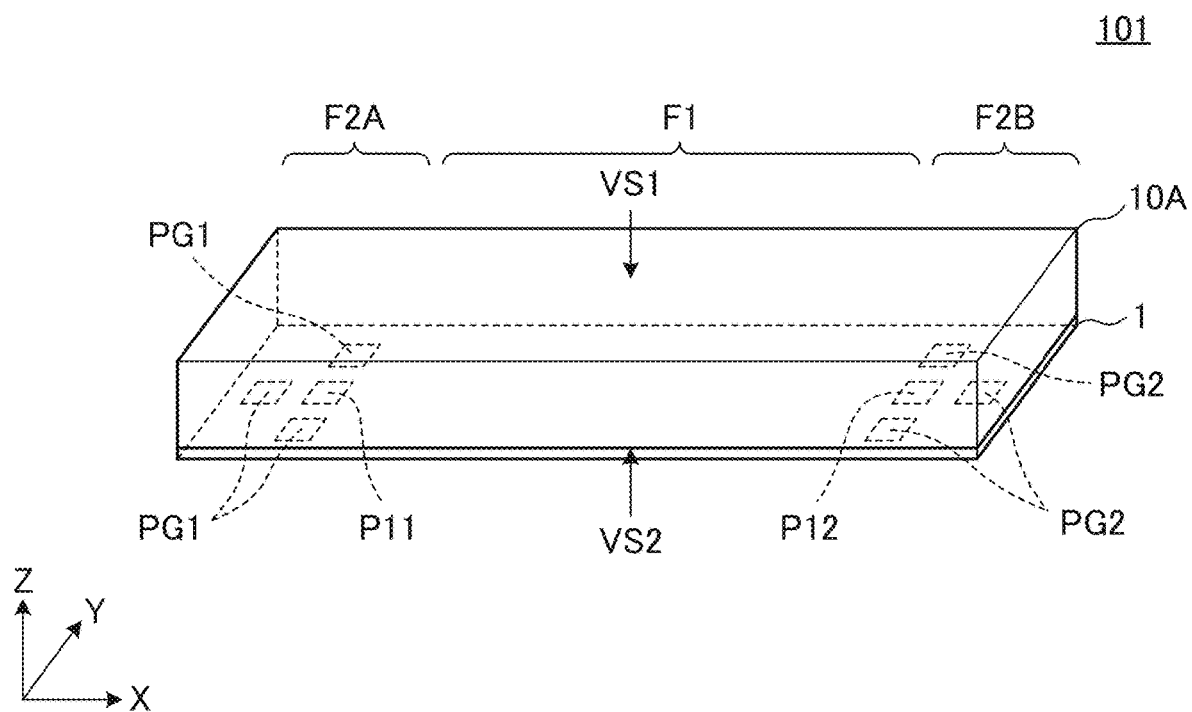
FIG. 1 is an external perspective view of a resin substrate 101 according to a first preferred embodiment of the present invention.

Preferred embodiments of the present invention will be described below with reference to the drawings and some specific examples. In the drawings, the same or similar portions and elements are denoted with the same reference signs. For convenience of description of main points or ease of understanding, the preferred embodiments will be described separately. However, the respective configurations in each of the preferred embodiments may be partially replaced and/or combined as appropriate within the technical range of the present invention. In a second and subsequent preferred embodiments, description of matters common to a first preferred embodiment will be omitted as appropriate, and only different points will be described. Particularly, the same advantageous operations and effects in the same or similar configuration will not be described in each of the preferred embodiments.

First Preferred Embodiment

Figure 2:
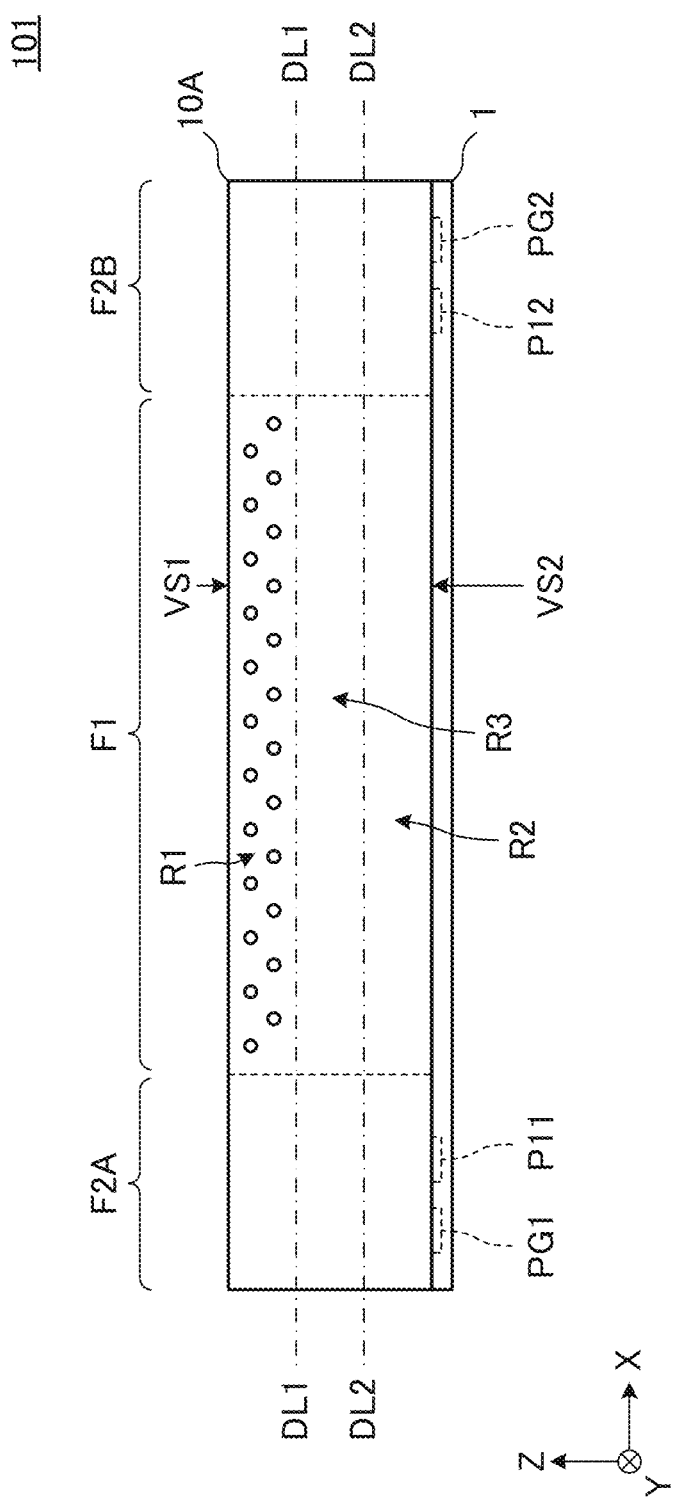
FIG. 2 is a front view of the resin substrate 101.

FIG. 1 is an external perspective view of a resin substrate 101 according to a first preferred embodiment of the present invention. FIG. 2 is a front view of the resin substrate 101. FIG. 3 is an exploded plan view of the resin substrate 101. In FIG. 3, for ease of understanding of the structure, a signal line 40 is shown with a dot pattern.

The resin substrate 101 includes an insulating base material 10A, the signal line 40, a ground conductor 51, a ground conductor 52, a ground conductor 53, an interlayer connection conductor V11, an interlayer connection conductor V12, an interlayer connection conductor VG1, an interlayer connection conductor VG2, a mounting electrode P11, a mounting electrode P12, a ground electrodes PG1, a ground electrodes PG2, a protective layer 1 and others.

The insulating base material 10A is a resin (i.e., a thermoplastic resin) element having a cuboid shape, with its longitudinal direction aligned with an X-axis direction. The insulating base material 10A includes a first main surface VS1 and a second main surface VS2 that oppose each other. Each of the first main surface VS1 and the second main surface VS2 is parallel or substantially parallel to the X-axis direction and a Y-axis direction.

In the insulating base material 10A, the second main surface VS2 includes the mounting electrode P11, the mounting electrode P12, the ground conductor 51, and the protective layer thereon. Each of the mounting electrode P11, the mounting electrode P12, the ground electrodes PG1, and the ground electrodes PG2 is exposed on the second main surface VS2. Concurrently, the insulating base material 10A includes the signal line 40, the ground conductor 52, the ground conductor 53, and the interlayer connection conductors V11, V12, VG1, and VG2 therein.

The insulating base material 10A is divided into a first section F1, a second section F2A, and a second section F2B. The first section F1 includes at least a portion subjected to bending (as will be described later). In the insulating base material 10A, the second section F2A, the first section F1, and the second section F2B are arranged in a positive X-axis direction in this sequential order.

As shown in FIG. 2, the first section F1 includes a first region R1, a second region R2, and a third region R3. When the first section F1 is evenly divided into three in a Z-axis direction (i.e., divided in the Z-axis direction with a division line DL1 and a division line DL2, each shown in FIG. 2), the first region R1 is closest to the first main surface VS1. Concurrently, when the first section F1 is evenly divided into three in the Z-axis direction, the second region R2 is closest to the second main surface VS2, and the third region R3 is located between the first region R1 and the second region R2.

The insulating base material 10A includes a plurality of resin layers, i.e., a resin layer 11a, a resin layer 12a, and a resin layer 13a, each made of a resin (thermoplastic resin). The resin layers 11a, 12a, and 13a are laminated in this sequential order to form the insulating base material 10A. Each of the resin layers 11a, 12a, and 13a is a rectangular or substantially rectangular flat plate, with its longitudinal direction aligned with the X-axis direction. Each of the resin layers 11a, 12a, and 13a is, for example, a resin sheet including a photo-oriented polymer in addition to a liquid crystal polymer (LCP) or a polyimide (PI), for example. The photo-oriented polymer is preferably, for example, a vinyl cinnamate polymer, a chalcone polymer, an azo polymer, or a polyamide polymer.

The resin layer 11a includes, on its rear surface, the mounting electrode P11, the mounting electrode P12, and the ground conductor 51. The mounting electrode P11 is a conductor pattern having a rectangular or substantially rectangular shape and arranged near a first end of the resin layer 11a (i.e., a left end of the resin layer 11a in FIG. 3). The mounting electrode P12 is a conductor pattern having a rectangular or substantially rectangular shape and arranged near a second end of the resin layer 11a (i.e., a right end of the resin layer 11a in FIG. 3). The ground conductor 51 is a conductor pattern having a rectangular or substantially rectangular shape and arranged over an entire or substantially an entire surface of the resin layer 11a. Each of the mounting electrode P11, the mounting electrode P12, and the ground conductor 51 is the conductor pattern such as, for example, a Cu foil. Concurrently, the resin layer 11a includes the interlayer connection conductors V11, the interlayer connection conductor V12, and the interlayer connection conductors VG1 (provided in plural number) thereon.

The resin layer 12a includes, on its rear surface, the signal line 40 and the ground conductor 52. The signal line 40 is a conductor pattern having a linear shape and extending in a transmission direction (i.e., the X-axis direction). The ground conductor 52 is a conductor pattern having a rectangular shape and arranged over an entire or substantially an entire surface of the resin layer 12a. Each of the signal line 40 and the ground conductor 52 is a conductor pattern such as, for example, the Cu foil. Concurrently, the resin layer 12a includes the interlayer connection conductors VG2 (provided in plural number) thereon.

The resin layer 13a includes, on its rear surface, the ground conductor 53. The ground conductor 53 is a conductor pattern having a rectangular or substantially rectangular shape and arranged over an entire or substantially entire surface of the resin layer 13a. The ground conductor 53 is the conductor pattern such as, for example, the Cu foil.

The protective layer 1 is a protective film laminated on the rear surface of the resin layer 11a, and has the same or substantially the same planar shape as the resin layer 11a. The protective layer 1 includes an opening OP11 and an opening OP12 positioned respectively in correspondence to the mounting electrode P11 and the mounting electrode P12. With this configuration, even when the protective layer 1 is on the rear surface of the resin layer 11a (i.e., the second main surface VS2 of the insulating base material 10A), the mounting electrodes P11 and P12 are respectively externally exposed from the openings OP11 and OP12. Concurrently, the protective layer 1 includes openings OG1 and openings OG2, each provided in plural number and positioned in correspondence to the ground conductor 51. With this configuration, even when the protective layer 1 is on the rear surface of the resin layer 11a, a portion of the ground conductor 51 is externally exposed from each of the openings OG1 and OG2. In the present preferred embodiment, the portion of the ground conductor 51 exposed from the opening OG1 corresponds to each of the "ground electrodes PG1", and the portion of the ground conductor 51 exposed from the opening OG2 corresponds to each of the "ground electrodes PG2". The protective layer 1 is a coverlay film, such as, for example, the polyimide (PI) or a polyethylene terephthalate (PET), or a solder resist film including, for example, an epoxy resin as a main component.

The mounting electrode P11 and the mounting electrode P12 are electrically conductive. More specifically, the mounting electrode P11 is connected to one end of the signal line 40 via the interlayer connection conductor V11. The mounting electrode P12 is connected to the other end of the signal line 40 via the interlayer connection conductor V12. The ground conductor 51 (as the ground electrodes PG1 and PG2), the ground conductor 52, and the ground conductor 53 are electrically conductive. More specifically, the ground conductor 51 is connected to the ground conductor 52 via the interlayer connection conductors VG1 (provided in plural number), and the ground conductor 52 is connected to the ground conductor 53 via the interlayer connection conductors VG2 (provided in plural number).

In the present preferred embodiment, the signal line 40, the ground conductor 51, the ground conductor 53, the resin layer 11a located between the signal line 40 and the ground conductor 51, and the resin layer 12a located between the signal line 40 and the ground conductor 53 are configured to define a transmission line (i.e., a strip-line transmission line).

In the insulating base material 10A according to the present preferred embodiment, the first region R1 has a greater degree of resin molecular orientation in the Y-axis direction than other areas (i.e., the second section F2A, the second section F2B, the second region R2 and the third region R3). Particularly, the first region R1 has a greater degree of resin molecular orientation in the Y-axis direction than the second sections F2A and F2B.

In the present preferred embodiment, in each of the other areas, the resin molecular orientation in the X-axis direction and the resin molecular orientation in the Y-axis direction are isotropic.

Note that, the degree of resin molecular orientation is determined as follows: azimuth (β angle) in a certain region is measured by, for example, (wide angle) X-ray diffraction, and based on the azimuth and intensity distribution, each of the resin molecular orientation (nx) in the X-axis direction and the resin molecular orientation (ny) in the Y-axis direction is obtained. In this measurement, "the resin molecules are oriented in the X-axis direction" is defined as a case that satisfies a relationship: (ny/nx)≤about 0.9 in the certain region; and "the resin molecules are oriented in the Y-axis direction" is defined as a case that satisfies a relationship: (nx/ny)≤about 0.9 in the certain region.

Further, in a case that satisfies each of the relationships of (ny/nx)>about 0.9 and (nx/ny)>about 0.9 (more preferably, (nx/ny)=about 1), the resin molecules are oriented in neither the X-axis direction nor the Y-axis direction. In other words, the resin molecular orientation in the X-axis direction and that in the Y-axis direction are isotropic.

Note that the "first section" corresponds to a region overlapping an area where the resin molecules are oriented in the X-axis direction or an area where the resin molecules are oriented in the Y-axis direction in, for example, a plan view (i.e., when viewed in the Z-axis direction); and the "second section" corresponds to the other regions. A boundary surface between the area where the resin molecules are oriented in the X-axis direction and the other areas is defined as, for example, a surface where the relationship (ny/nx) about 0.9 is changed to the relationship (ny/nx)>about 0.9. Concurrently, a boundary surface between the area where the resin molecules are oriented in the Y-axis direction and the other areas is defined as, for example, a surface where the relationship (nx/ny) about 0.9 is changed to the relationship (nx/ny)>about 0.9. Note that, in any one of the cases above, the boundary surface is included in the other areas (where the resin molecules are not oriented in the X-axis direction or in the Y-axis direction).

When a resin element includes resin molecules oriented in the Y-axis direction, the resin element has a greater Young's modulus in the Y-axis direction than a resin element having isotropic resin molecular orientation, and the resin element is smaller in Young's modulus in the X-axis direction than the resin element having the isotropic resin molecular orientation, the X-axis direction orthogonal or substantially orthogonal to the Y-axis direction. As has been described above, in the present preferred embodiment, the first region R1 has a greater degree of resin molecular orientation in the Y-axis direction than the other areas (i.e., the second section F2A, the second section F2B, the second region R2, and the third region R3). Particularly, the first region R1 has a greater degree of resin molecular orientation in the Y-axis direction than the second sections F2A and F2B. In other words, the first region R1 has a greater Young's modulus in the Y-axis direction than the other areas, and the first region R1 is smaller in Young's modulus in the X-axis direction than the other areas. Particularly, the first region R1 has a greater Young's modulus in the Y-axis direction than the second sections F2A and F2B, and the first region R1 is smaller in Young's modulus in the X-axis direction than the second sections F2A and F2B. With this configuration, when the first section F1 is bent, tensile stress is applied to the first region R1 in the X-axis direction, so that the first region R1 is subjected to tensile deformation to a greater extent than the other areas. Thus, in the insulating base material 10A, the first section F1 is bent more easily in the X-axis direction than the second sections F2A and F2B.

When a resin element has resin molecules oriented in the Y-axis direction, the resin element is smaller in linear expansion coefficient in the Y-axis direction than a resin element having the isotropic resin molecular orientation, and the resin element has a greater linear expansion coefficient in the X-axis direction than the resin element having the isotropic resin molecular orientation, the X-axis direction orthogonal or substantially orthogonal to the Y-axis direction. With this configuration, the first region R1 has a greater linear expansion coefficient in the X-axis direction than the other areas (i.e., the second section F2A, the second section F2B, the second region R2 and the third region R3). Particularly, the first region R1 has a greater linear expansion coefficient in the X-axis direction than the second sections F2A and F2B. Thus, when the insulating base material 10A is heated (e.g., when the insulating base material 10A is subjected to heating and bending), due to the difference in linear expansion coefficient in the Z-axis direction, the first section F1 is bent more easily in the X-axis direction than the second sections F2A and F2B in the insulating base material 10A.

Further, in the present preferred embodiment, as shown in FIG. 3, the interlayer connection conductors V11, V12, VG1, and VG2 are only in the second sections F2A and F2B. In a case where these interlayer connection conductors are in the first section F1 (that is to be subjected to bending), when the first section F1 is bent, bending stress is applied to the first section F1, causing the interlayer connection conductors to be broken. On the other hand, with the configuration according to the present preferred embodiment, the interlayer connection conductors V11, V12, VG1, and VG2 are not in the first section F1. Thus, when the first section F1 is subjected to bending, the interlayer connection conductors V11, V12, VG1, and VG2 are less prone to being broken.

In the present preferred embodiment, the insulating base material 10A includes the plurality of resin layers, i.e., the resin layers 11a, 12a, and 13a, each made of the thermoplastic resin. With this configuration, as will be described in detail later, when the resin layers 11a, 12a, and 13a have been laminated and heat-pressed (i.e., collectively pressed), the insulating base material 10A is easily formed without an adhesive layer. Accordingly, the manufacturing steps of the resin substrate 101 are simplified, thus keeping costs low. With the insulating base material 10A as the thermoplastic resin element, the present preferred embodiment provides a resin substrate that is easily plastically deformed and that maintains (or retains) a desirable shape.

Figure 4:
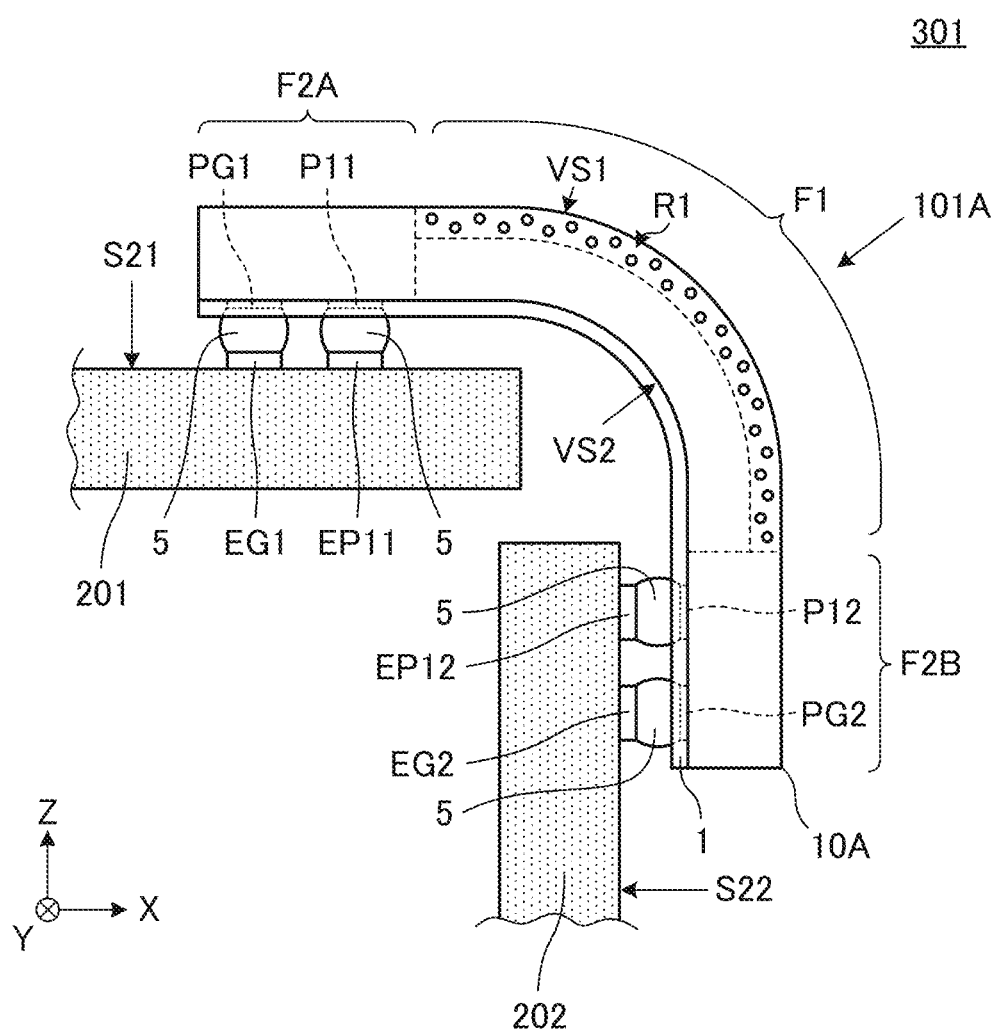
FIG. 4 is a cross-sectional view of a main portion of an electronic device 301 according to the first preferred embodiment of the present invention.

A resin substrate according to preferred embodiments of the present invention is used, for example, as will be described below. FIG. 4 is a cross-sectional view of a main portion of an electronic device 301 according to the first preferred embodiment.

The electronic device 301 according to the present preferred embodiment includes a resin substrate 101A, a circuit board 201, and a circuit board 202. Unlike the resin substrate 101, the resin substrate 101A includes a first section F1 that has been bent (i.e., plastically deformed). The resin substrate 101A includes an insulating base material 10A, and the insulating base material 10A includes a bent portion as the first section F1, the bent portion having been bent in the Z-axis direction. Other configurations of the resin substrate 101A are the same or substantially the same as those of the resin substrate 101.

The bending of the first section F1 of the insulating base material 10A is performed in steps described below. The insulating base material 10A is heated and bent with a mold or the like, and when the thermoplastic resin of the insulating base material 10A has been cooled down and solidified, the mold or the like is removed such that the first section F1 is maintained (or remained) bent. Alternatively, for example, the insulating base material 10A additionally includes a thermal cross-linking agent (e.g., epoxy resin), the first section F1 of the insulating base material 10A is bent into a desirable shape, and the insulating base material 10A is heated such that the first section F1 is maintained bent.

The circuit board 201 includes a first surface S21, and the circuit board 202 includes a second surface S22. As shown in FIG. 4, the first surface S21 is parallel or substantially parallel to an X-Y plane, and the second surface S22 is parallel or substantially parallel to a Y-Z plane. The first surface S21 of the circuit board 201 includes an external electrode EP11 and a ground electrode EG1 thereon, and the second surface S22 of the circuit board 202 includes an external electrode EP12 and a ground electrode EG2 thereon. The resin substrate 101A is mounted on the circuit boards 201 and 202, with the first section F1 being bent. More specifically, the resin substrate 101A includes a mounting electrode P11 that is to be connected to the external electrode EP11 of the circuit board 201 with a conductive bonding material 5, such as solder, for example. The resin substrate 101A includes a ground electrode PG1 that is to be connected to the ground electrode EG1 of the circuit board 201 with the conductive bonding material 5. The resin substrate 101A includes a mounting electrode P12 that is to be connected to the external electrode EP12 of the circuit board 202 with the conductive bonding material 5. The resin substrate 101A further includes a ground electrode PG2 that is to be connected to the ground electrode EG2 of the circuit board 202 with the conductive bonding material 5.

As has been described above, the first section F1 of the resin substrate 101A is easily bent in the Z-axis direction. With this configuration, the resin substrate 101A is easily mounted on the circuit boards 201 and 202, each with its surface at different height in the Z-axis direction from the other.

Further, as has been described above, in each of the second sections F2A and F2B, the resin molecular orientation in the X-axis direction and the resin molecular orientation in the Y-axis direction are isotropic, and the second sections F2A and F2B respectively include the mounting electrodes P11 and P12 in the resin substrate 101A. With this configuration, when the resin substrate 101A is mounted on the circuit boards 201 and 202 (e.g., when the resin substrate 101A is mounted by hot bar soldering or is in a reflow step), each of the second sections F2A and F2B is less prone to being deformed. Accordingly, a bonding failure between the resin substrate 101A and the circuit board 201 or the circuit board 202 is reduced or prevented.

Figure 5:
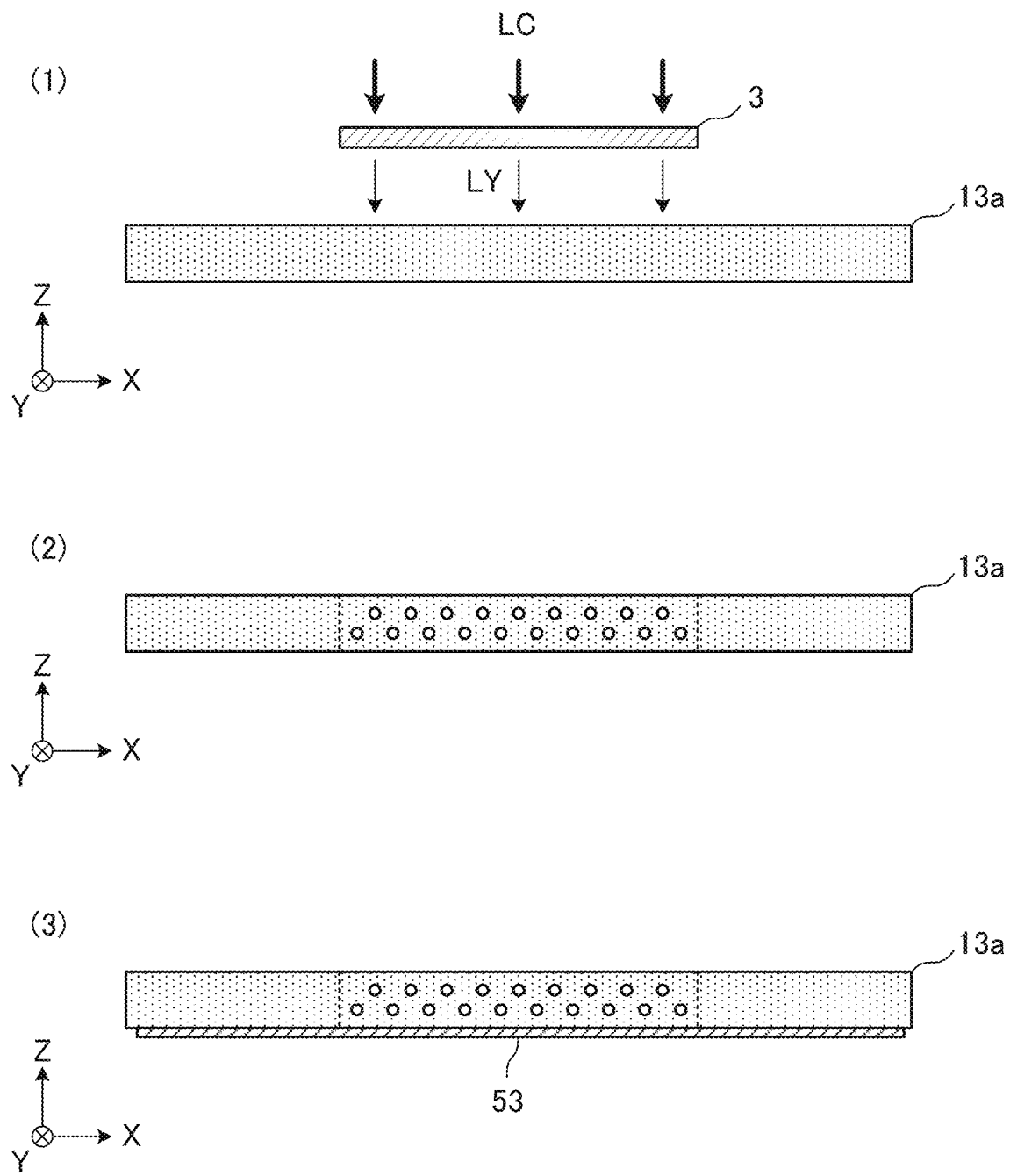
FIG. 5 is a cross-sectional view showing steps for manufacturing a resin layer 13a in a sequential order, the steps before the resin layer 13a is laminated.
Figure 6:
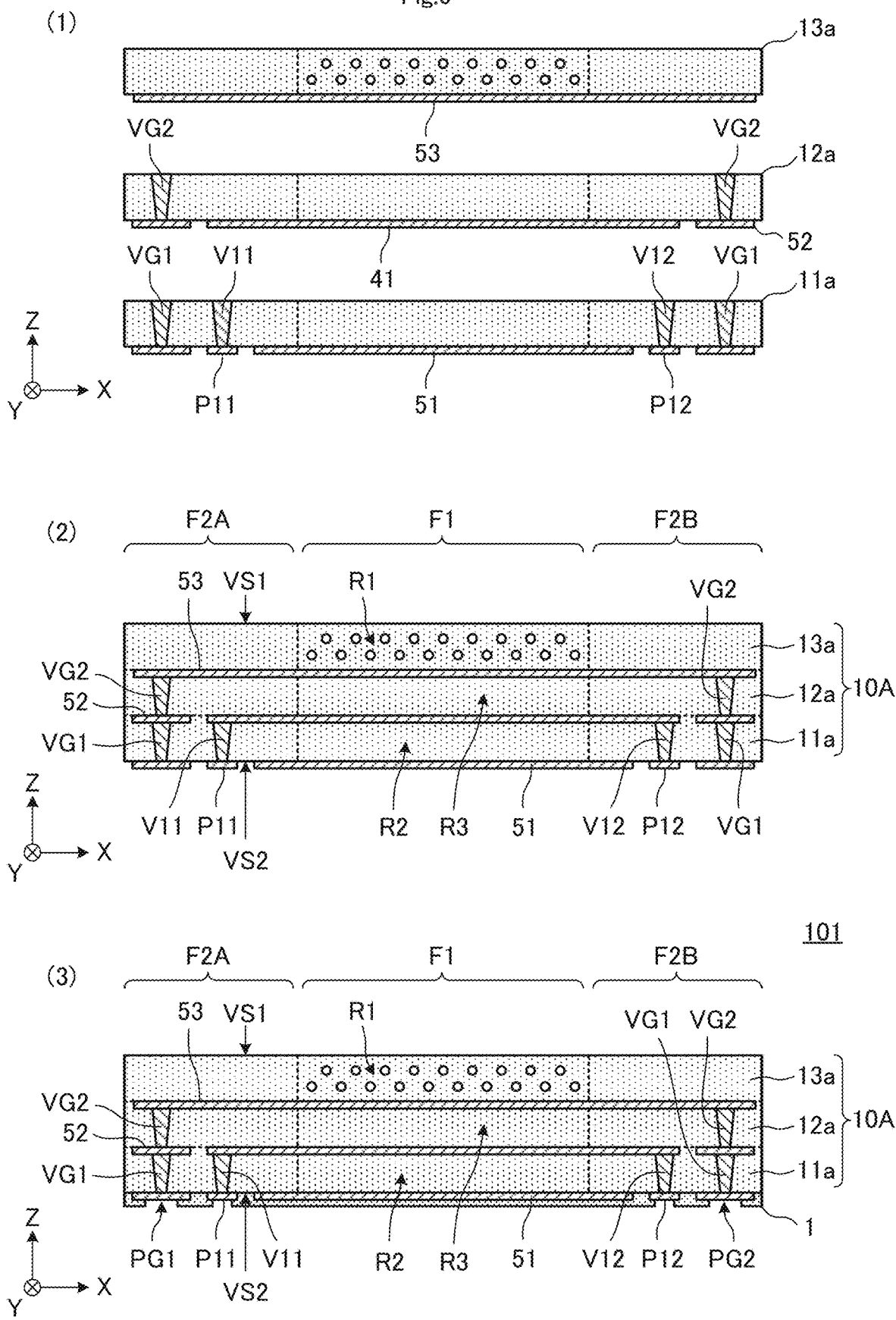
FIG. 6 is a cross-sectional view showing steps for manufacturing the resin substrate 101 in a sequential order.

The resin substrate 101 according to the present preferred embodiment is manufactured, for example, in steps described below. FIG. 5 is a cross-sectional view showing steps for manufacturing the resin layer 13a in a sequential order, the steps before the resin layer 13a is laminated. FIG. 6 is a cross-sectional view showing the steps for manufacturing the resin substrate 101 in a sequential order. Note that, for convenience of description, FIG. 5 shows the resin layer 13a only. Further, for convenience of description, FIGS. 5 and 6 show steps for manufacturing a "single chip (i.e., single piece)", but in actual manufacturing steps of the resin substrate 101, an aggregate substrate is used. The "aggregate substrate" corresponds to a mother substrate including a plurality of the resin substrates 101. The same applies to the subsequent drawings, each showing the corresponding manufacturing steps.

First, as shown in (1) of FIG. 5, the resin layer 13a formed of the resin (thermoplastic resin) is prepared. The resin layer 13a is, for example, the resin sheet including the photo-oriented polymer in addition to the liquid crystal polymer (LCP) or the polyimide (PI). While not shown, the same applies to each of the resin layers 11a and 12a.

Next, in the resin layer 13a, an area that is to be the first region of the insulating base material (i.e., an area near a center of the resin layer 13a in the X-axis direction as shown in (1), (2) and (3) of FIG. 5) is irradiated with light LC, so that the resin molecules are oriented in the Y-axis direction. More specifically, the light LC is polarized in the Y-axis direction by a polarizing plate 3 to be light LY; and the resin layer 13a is irradiated with the light LY (that has been polarized), so that the resin molecules in the area irradiated are oriented in the Y-axis direction. As a result, as shown in (2) of FIG. 5, in the resin layer 13a, the resin molecules in the area (that is to be the first region) are oriented in the Y-axis direction.

Here, in the resin layer, the area (that is to be the first region of the insulating base material) is irradiated with light or laser, so that the resin molecules in the area are oriented in the Y-axis direction. A sequence of these steps corresponds to an example of a "first molecular orientation step".

Subsequently, as shown in (3) of FIG. 5, the ground conductor 53 is arranged on the rear surface of the resin layer 13a. More specifically, on the rear surface of the resin layer 13a, a metal foil is laminated and patterned by photolithography such that the ground conductor 53 is arranged on the rear surface of the resin layer 13a.

Next, as shown in (1) of FIG. 6, the plurality of resin layers, i.e., the resin layers 11a, 12a, and 13a are laminated in this sequential order. Note that, while not shown, the resin layer 11a includes the mounting electrode P11, the mounting electrode P12, the ground conductor 51, the interlayer connection conductor V11, the interlayer connection conductor V12, the interlayer connection conductors VG1, and others thereon, and the resin layer 12a includes the signal line 41, the ground conductor 52, the interlayer connection conductors VG2, and others thereon. The interlayer connection conductors are arranged, for example, as follows. Each of the resin layers includes a hole formed by laser irradiation, drilling, or the like, the hole is filled with a conductive paste including a metal powder, e.g., Cu, Sn, or an alloy thereof, and a resin material, and the resin layers are to be heat-pressed such that the conductive paste is solidified.

Having been laminated on each other, the resin layers 11a, 12a, and 13a are heat-pressed to form the insulating base material 10A as shown in (2) of FIG. 6. In the insulating base material 10A, the first region R1 has a greater degree of resin molecular orientation in the Y-axis direction than the second region R2, the third region R3, the second section F2A, and the second section F2B. Particularly, the first region R1 has a greater degree of resin molecular orientation in the Y-axis direction than the second sections F2A and F2B.

When the first molecular orientation step has been completed, the plurality of resin layers including the resin layer 13a where the resin molecules are oriented in the Y-axis direction, in other words, the resin layers 11a, 12a, and 13a, are laminated, and the resin layers 11a, 12a, and 13a are heat-pressed to form the insulating base material 10A. A sequence of these steps corresponds to an example of a "first insulating base material formation step".

Subsequently, the protective layer 1 is arranged on the second main surface VS2 of the insulating base material 10A, resulting in the resin substrate 101 as shown in (3) of FIG. 6. The protective layer 1 is a coverlay film, such as, for example, the polyimide (PI) or a polyethylene terephthalate (PET), or a solder resist film containing, for example, an epoxy resin as a main component.

With the manufacturing method described above, the resin substrate 101 having the following advantageous feature is easily manufactured. Even when the first section F1 of the insulating base material 10A is bent, each of the second sections F2A and F2B is less prone to being deformed or bent.

With the manufacturing method described above, when the resin layers 11a, 12a, and 13a, each formed of the thermoplastic resin, have been laminated and heat-pressed (i.e., collectively pressed), the resin substrate 101 is easily formed. Accordingly, the manufacturing steps of the resin substrate 101 are simplified, thus keeping costs low.

Further, with the manufacturing method described above, in the resin layer 13a before being laminated, the resin molecules are oriented. Accordingly, compared with a case where the resin layers 11a, 12a, and 13a are laminated to form an insulating base material and then resin molecules are oriented in the insulating material, the first region may be designed to have a wider range of degree of resin molecular orientation.

Second Preferred Embodiment

In a second preferred embodiment of the present invention, an example of a resin substrate which includes a resin layer with resin molecules oriented in the X-axis direction, will be described.

Figure 7:
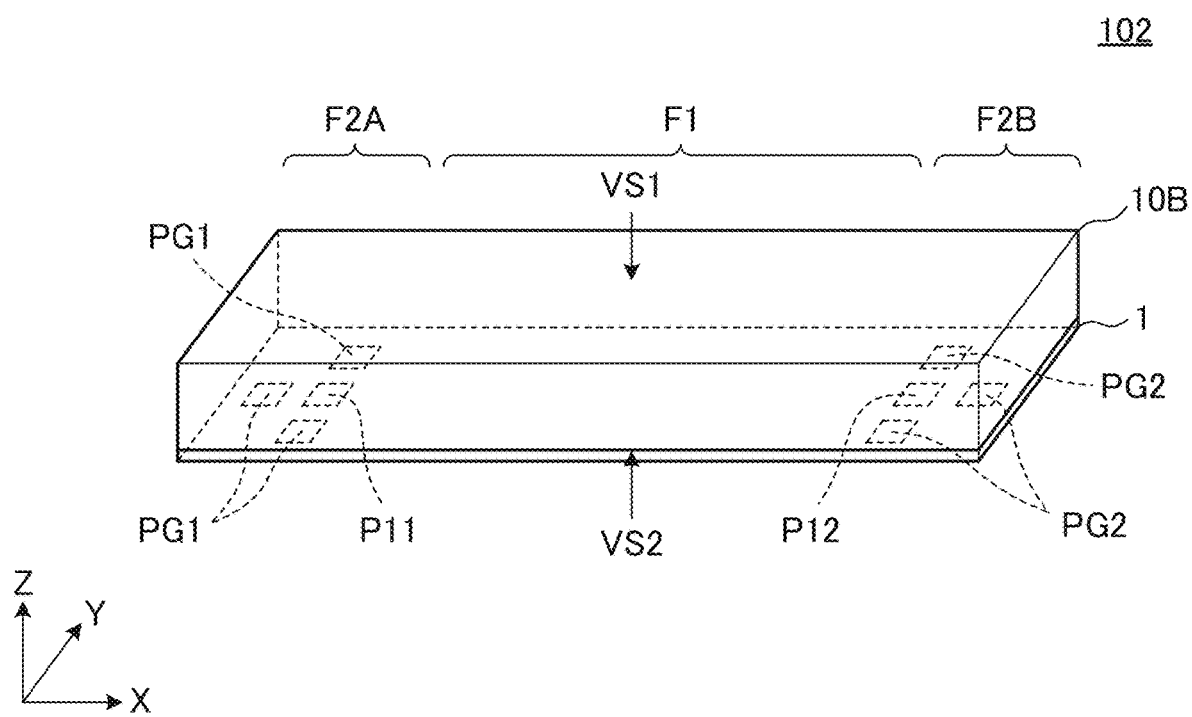
FIG. 7 is an external perspective view of a resin substrate 102 according to a second preferred embodiment of the present invention.
Figure 8:
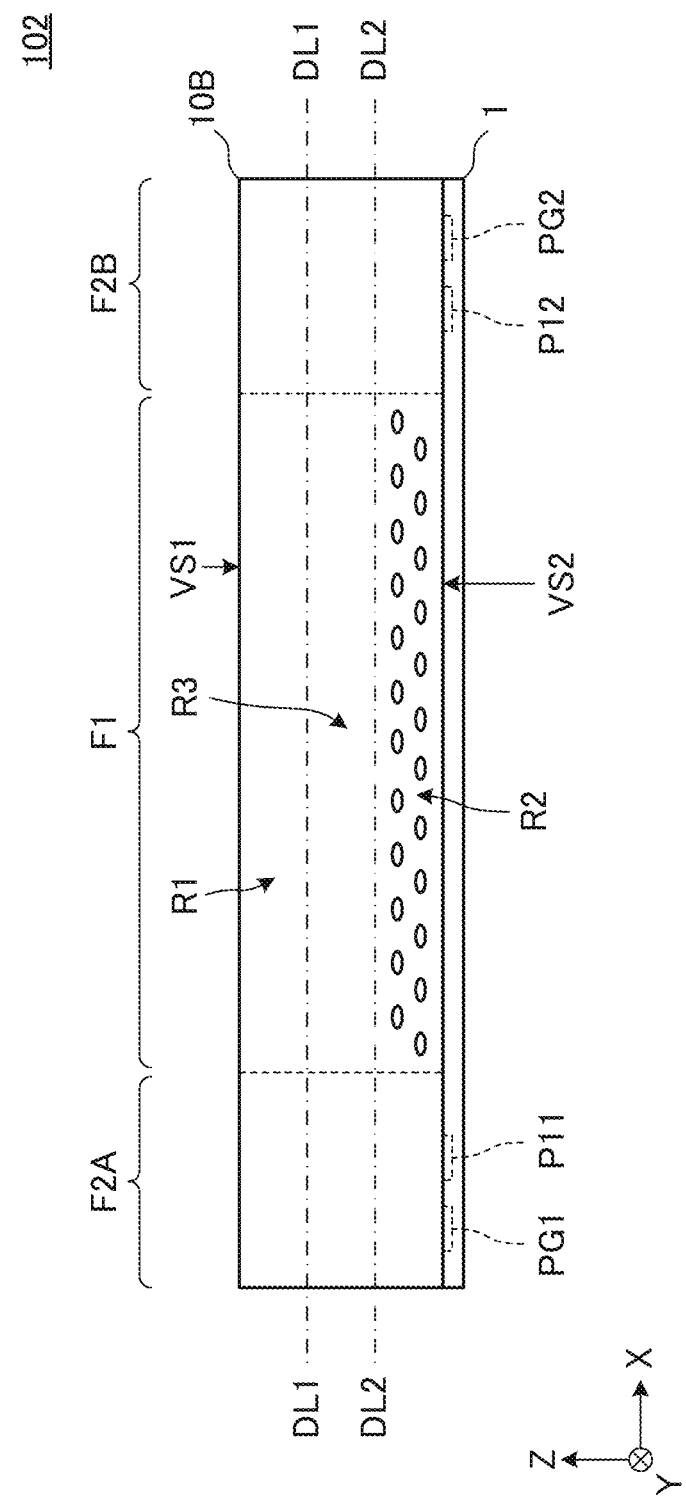
FIG. 8 is a front view of the resin substrate 102.

FIG. 7 is an external perspective view of a resin substrate 102 according to the second preferred embodiment. FIG. 8 is a front view of the resin substrate 102. FIG. 9 is an exploded plan view of the resin substrate 102. In FIG. 9, for ease of understanding of the structure, a signal line 40 is shown with a dot pattern.

Unlike the resin substrate 101 according to the first preferred embodiment, the resin substrate 102 includes an insulating base material 10B. Other configurations of the resin substrate 102 are the same or substantially the same as those of the resin substrate 101.

The resin substrate 102 is different from the resin substrate 101 according to the first preferred embodiment, as described below.

The insulating base material 10B includes a plurality of resin layers. i.e., a resin layer 11b, a resin layer 12b, and a resin layer 13b, each made of a resin (for example, thermoplastic resin). The resin layers 11b, 12b, and 13b are laminated in this sequential order to define the insulating base material 10B. The resin layers 11b, 12b, and 13b respectively have the same or substantially the same configurations as those of the resin layers 11a, 12a, and 13a described in the first preferred embodiment.

In the insulating base material 10B according to the present preferred embodiment, a second region R2 has a greater degree of resin molecular orientation in an X-axis direction than the other areas (i.e., a second section F2A, a second section F2B, a first region R1, and a third region R3). Particularly, the second region R2 has a greater degree of resin molecular orientation in the X-axis direction than the second sections F2A and F2B. In other words, the second region R2 has a greater Young's modulus in the X-axis direction than the other areas, and the second region R2 is smaller in Young's modulus in a Y-axis direction than the other areas. Particularly, the second region R2 has a greater Young's modulus in the X-axis direction than the second sections F2A and F2B, and the second region R2 is smaller in Young's modulus in the Y-axis direction than the second sections F2A and F2B. In the present preferred embodiment, in each of the other areas, the resin molecular orientation in the X-axis direction and the resin molecular orientation in the Y-axis direction are isotropic.

With this configuration, when a first section F1 is bent, compressive stress is applied to the second region R2 in the X-axis direction, so that the second region R2 is more subjected to compressive deformation than the other areas (i.e., the second section F2A, the second section F2B, the first region R1, and the third region R3) Thus, in the insulating base material 10B, the first section F1 is bent more easily than the second sections F2A and F2B.

Figure 10:
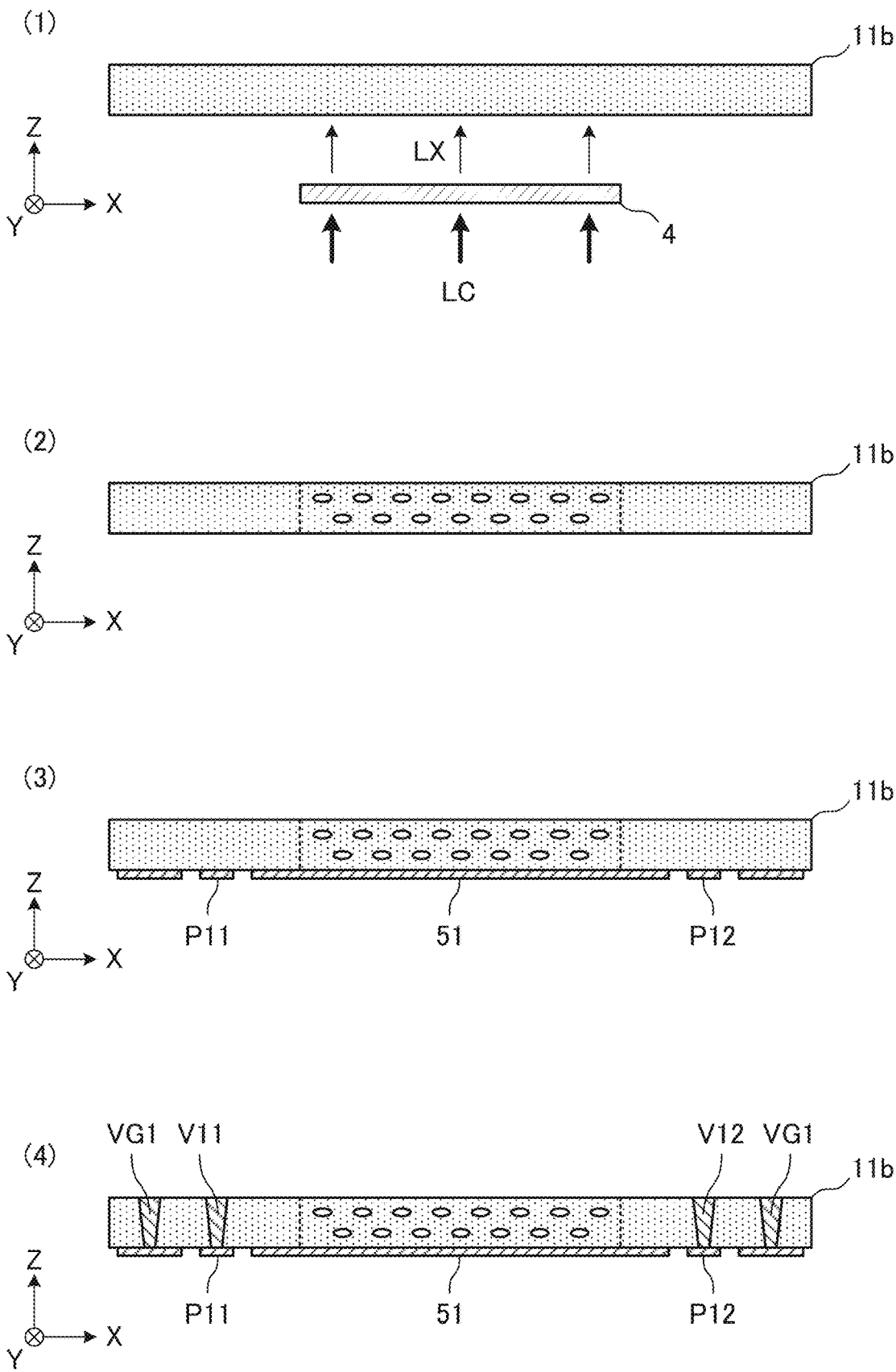
FIG. 10 is a cross-sectional view showing steps for manufacturing a resin layer 11b in a sequential order, the steps before the resin layer 11b is laminated.

The resin substrate 102 according to the present preferred embodiment is manufactured, for example, in steps described below. FIG. 10 is a cross-sectional view showing steps for manufacturing the resin layer 11b in a sequential order, the steps before the resin layer 11b is laminated. FIG. 11 is a cross-sectional view showing steps for manufacturing the resin substrate 102 in a sequential order. Note that, for convenience of description, FIG. 10 shows the resin layer 11b only.

First, as shown in (1) of FIG. 10, the resin layer 11b formed of the resin (thermoplastic resin) is prepared. The resin layer 11b is preferably, for example, a resin sheet including a photo-oriented polymer, in addition to a liquid crystal polymer (LCP) or a polyimide (PI). While not shown, the same applies to each of the resin layers 12b and 13b.

Next, in the resin layer 11b, an area that is to be the second region of the insulating base material (i.e., an area near a center of the resin layer 11b in the X-axis direction as shown in (1), (2), (3) and (4) of FIG. 10) is irradiated with light LC, so that the resin molecules are oriented in the X-axis direction. More specifically, the light LC is polarized in the X-axis direction by a polarizing plate 4 to be light LX, and the resin layer 11b is irradiated with the light LX (that has been polarized), so that the resin molecules in the area irradiated are oriented in the X-axis direction. As a result, as shown in (2) of FIG. 10, in the resin layer 11b, the resin molecules in the area (that is to be the second region) are oriented in the X-axis direction.

Here, in the resin layer, the area (that is to be the second region of the insulating base material) is irradiated with light or a laser, so that the resin molecules in the area are oriented in the X-axis direction. A sequence of these steps corresponds to an example of a "second molecular orientation step".

Next, as shown in (3) of FIG. 10, a mounting electrode P11, a mounting electrode P12, and a ground conductor 51 are provided on a rear surface of the resin layer 11b. More specifically, on the rear surface of the resin layer 11b, a metal foil is laminated and patterned by photolithography such that the mounting electrode P11, the mounting electrode P12, and the ground conductor 51 are provided on the rear surface of the resin layer 11b.

Subsequently, as shown in (4) of FIG. 10, a plurality of interlayer connection conductors, i.e., an interlayer connection conductor V11, an interlayer connection conductor V12, and interlayer connection conductors VG1, are provided on the resin layer 11b. The interlayer connection conductors V11, V12, and VG1 are configured as follows: the resin layer 11b includes a hole formed by laser irradiation or drilling, the hole is filled with a conductive paste including a metal powder, e.g., Cu, Sn, or an alloy thereof, and a resin material, and the resin layer 11b is to be heat-pressed such that the conductive paste is solidified.

Next, as shown in (1) of FIG. 11, the plurality of resin layers, i.e., the resin layers 11b, 12b, and 13b are laminated in this sequential order. Note that, while a description of the manufacturing steps is omitted, the resin layer 12b includes a signal line 41, a ground conductor 52, interlayer connection conductors VG2, and others thereon, and the resin layer 13b includes a ground conductor 53 thereon. Having been laminated, the resin layers 11b, 12b, and 13b are heat-pressed to form the insulating base material 10B as shown in (2) of FIG. 11. Note that, in the insulating base material 10B, the second region R2 has a greater degree of resin molecular orientation in the X-axis direction than the first region R1, the third region R3, the second section F2A, and the second section F2B. Particularly, the second region R2 has a greater degree of resin molecular orientation in the X-axis direction than the second sections F2A and F2B.

When the second molecular orientation step has been completed, the plurality of resin layers including the resin layer 11b where the resin molecules are oriented in the X-axis direction, in other words, the resin layers 11b, 12b, and 13b, are laminated, and the resin layers 11b, 12b, and 13b are heat-pressed to form the insulating base material 10B. A sequence of these steps corresponds to an example of a "first insulating base material formation step".

Subsequently, a protective layer 1 is provided on a second main surface VS2 of the insulating base material 10B, resulting in the resin substrate 102 as shown in (3) of FIG. 11.

With the manufacturing method described above, the resin substrate 102 having the following advantageous feature is easily manufactured. In the insulating base material 10B, even when the first section F1 is bent, each of the second sections F2A and F2B is less prone to being deformed or bent.

Third Preferred Embodiment

In a third preferred embodiment of the present invention, an example of a resin substrate which includes a resin layer having resin molecules oriented in the Y-axis direction and a resin layer having resin molecules oriented in the X-axis direction, will be described.

Figure 12A:
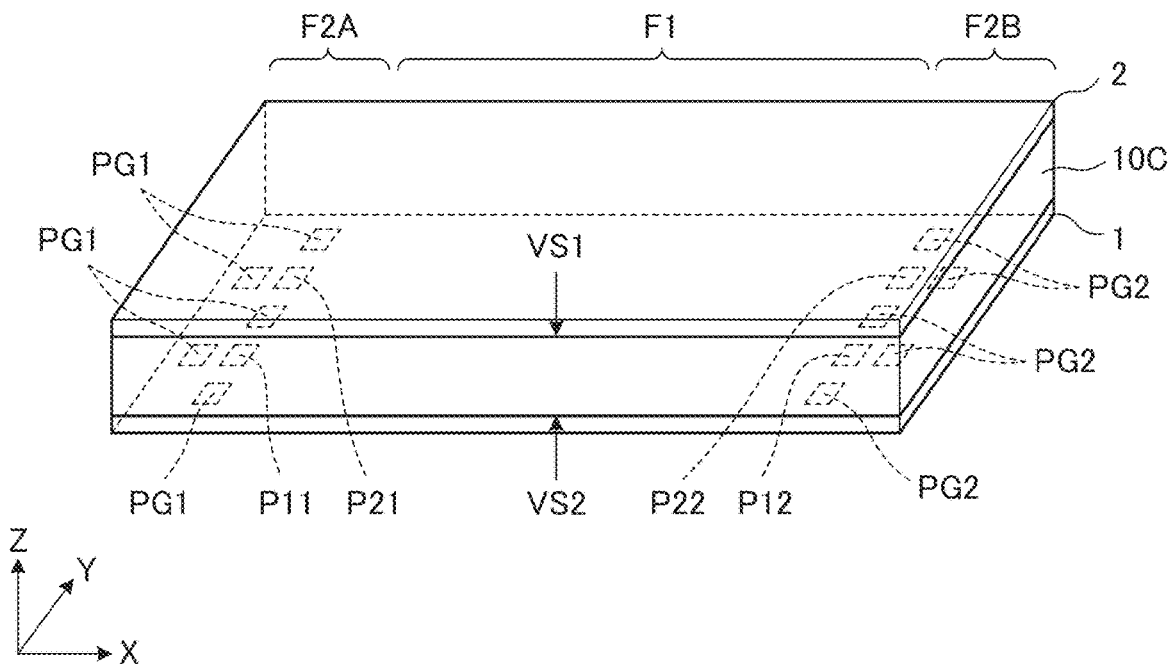
FIG. 12A is an external perspective view of a resin substrate 103 according to a third preferred embodiment of the present invention.
Figure 12B:
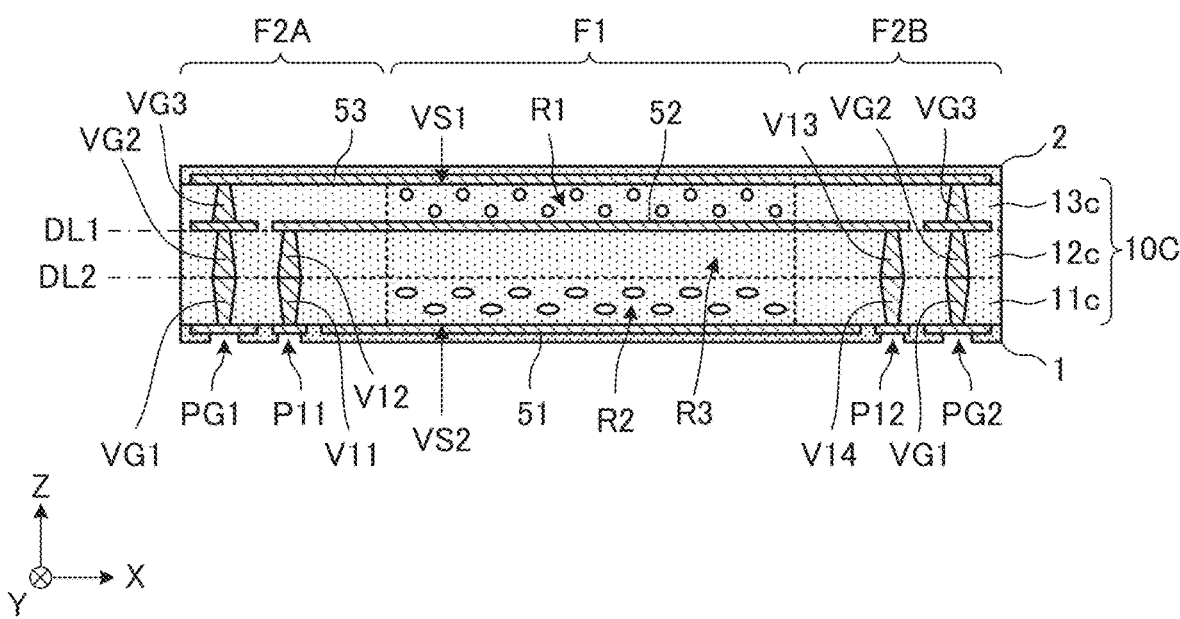
FIG. 12B is a cross-sectional view of the resin substrate 103.

FIG. 12A is an external perspective view of a resin substrate 103 according to the third preferred embodiment, and FIG. 12B is a cross-sectional view of the resin substrate 103. FIG. 13 is an exploded plan view of the resin substrate 103. In FIG. 13, for ease of understanding of the structure, each of a signal line 41 and a signal line 42 is shown with a dot pattern.

Unlike the resin substrate 101 according to the first preferred embodiment, the resin substrate 103 includes an insulating base material 10C, two signal lines, i.e., the signal lines 41 and 42, a protective layer 2, and others. Other configurations of the resin substrate 103 are the same or substantially the same as those of the resin substrate 101.

The resin substrate 103 is different from the resin substrate 101 according to the first preferred embodiment, as described below.

The insulating base material 10C includes a plurality of resin layers, i.e., a resin layer 11c, a resin layer 12c, and a resin layer 13c, each made of a resin (for example, thermoplastic resin). The resin layers 11c, 12c, and 13c are laminated in this sequential order to form the insulating base material 10C. Each of the resin layers 11c and 13c is preferably, for example, a resin sheet including a photo-oriented polymer, in addition to a liquid crystal polymer (LCP) or a polyimide (PI). The resin layer 12c is preferably, for example, a resin sheet including the liquid crystal polymer (LCP) or the polyimide (PI) as a main component.

The resin layer 11c includes, on its rear surface, a mounting electrode P11, a mounting electrode P12, a mounting electrode P21, a mounting electrode P22, and a ground conductor 51. Each of the mounting electrodes P11 and P21 is a conductor pattern having a rectangular or substantially rectangular shape and provided adjacent to or in the vicinity of a first end of the resin layer 11c (i.e., a left end of the resin layer 11c in FIG. 13). The mounting electrodes P11 and P21 are arranged in the Y-axis direction. Each of the mounting electrodes P12 and P22 is a conductor pattern having a rectangular or substantially rectangular shape and provided adjacent to or in the vicinity of a second end of the resin layer 11c (i.e., a right end of the resin layer 11c in FIG. 13). The mounting electrodes P12 and P22 are arranged in the Y-axis direction. The ground conductor 51 is a conductor pattern having a rectangular or substantially rectangular shape and provided over an entire or substantially an entire surface of the resin layer 11c. Concurrently, the resin layer 11c includes interlayer connection conductors V11, V14, V21, V24, and VG1 thereon.

The resin layer 12c includes, on its surface, the signal line 41, the signal line 42, and a ground conductor 52. Each of the signal lines 41 and 42 is a conductor pattern having a linear shape and extending in a transmission direction (i.e., the X-axis direction). The signal lines 41 and 42 are arranged in the Y-axis direction and are parallel or substantially parallel to each other. The ground conductor 52 is a conductor pattern having a rectangular or substantially rectangular shape and provided over an entire or substantially an entire surface of the resin layer 12c. Concurrently, the resin layer 12c includes interlayer connection conductors V12, V13, V22, V23, and VG2 thereon.

The resin layer 13c includes, on its surface, a ground conductor 53. The ground conductor 53 is a conductor pattern having a rectangular or substantially rectangular shape and provided over an entire or substantially entire surface of the resin layer 13c. Concurrently, the resin layer 13c includes interlayer connection conductors VG3 thereon.

A protective layer 1 is a protective film laminated on the rear surface of the resin layer 11c, and has the same or substantially the same planar shape as the resin layer 11c. The protective layer 1 includes an opening OP11, an opening OP12, an opening OP21, and an opening OP22 that are respectively positioned in correspondence to the mounting electrode P11, the mounting electrode P12, the mounting electrode P21, and the mounting electrode P22. With this configuration, even when the protective layer 1 is provided on the rear surface of the resin layer 11c (i.e., a second main surface VS2 of the insulating base material 10C), the mounting electrodes P11, P12, P21, and P22 are respectively externally exposed from the openings OP11, OP12, OP21, and OP22. Concurrently, the protective layer 1 includes openings OG1 and openings OG2, each provided in plural number and positioned in correspondence to the ground conductor 51. With this configuration, even when the protective layer 1 is provided on the rear surface of the resin layer 11c, a portion of the ground conductor 51 is externally exposed from each of the openings OG1 and OG2. In the present preferred embodiment, the portion of the ground conductor 51 exposed from the opening OG1 corresponds to each of the "ground electrodes PG1", and the portion of the ground conductor 51 exposed from the opening OG2 corresponds to each of the "ground electrodes PG2".

The protective layer 2 is a protective film laminated on the surface of the resin layer 13c, and has the same or substantially the same planar shape as the resin layer 13c.

The mounting electrode P11 and the mounting electrode P12 are electrically conductive. More specifically, the mounting electrode P11 is connected to one end of the signal line 41 via the interlayer connection conductors V11 and V12. The mounting electrode P12 is connected to the other end of the signal line 41 via the interlayer connection conductors V13 and V14. The mounting electrode P21 and the mounting electrode P22 are electrically conductive. More specifically, the mounting electrode P21 is connected to one end of the signal line 42 via the interlayer connection conductors V21 and V22. The mounting electrode P22 is connected to the other end of the signal line 42 via the interlayer connection conductors V23 and V24. The ground conductor 51 (as the ground electrodes PG1 and PG2), the ground conductor 52, and the ground conductor 53 are electrically connected. More specifically, the ground conductor 51 is connected to the ground conductor 52 via the interlayer connection conductors VG1 (provided in plural number) and the interlayer connection conductors VG2 (provided in plural number). The ground conductor is connected to the ground conductor 53 via the interlayer connection conductors VG3 (provided in plural number).

In the present preferred embodiment, the signal line 41, the ground conductor 51, the ground conductor 53, the resin layer 11c located between the signal line 41 and the ground conductor 51, the resin layer 12c located between the signal line 41 and the ground conductor 51, and the resin layer 13c located between the signal line 41 and the ground conductor 53 are configured to define a transmission line (i.e., a strip-line transmission line). Concurrently, the signal line 42, the ground conductor 51, the ground conductor 53, the resin layer 11c located between the signal line 42 and the ground conductor 51, the resin layer 12c located between the signal line 42 and the ground conductor 51, and the resin layer 13c located between the signal line 42 and the ground conductor 53 are configured to define a transmission line (i.e., strip-line transmission line).

In the present preferred embodiment, a first region R1 has a greater degree of resin molecular orientation in the Y-axis direction than the other areas (i.e., a second section F2A, a second section F2B, a second region R2, and a third region R3). Particularly, the first region R1 has a greater degree of resin molecular orientation in the Y-axis direction than the second sections F2A and F2B. Concurrently, the second region R2 has a greater degree of resin molecular orientation in the X-axis direction than the other areas (i.e., the second section F2A, the second section F2B, the first region R1, and the third region R3). Particularly, the second region R2 has a greater degree of resin molecular orientation in the X-axis direction than the second sections F2A and F2B. Note that, in each of the second sections F2A and F2B, the resin molecular orientation in the X-axis direction and the resin molecular orientation in the Y-axis direction are isotropic.

With this configuration, when the first section F1 is bent, tensile stress is applied to the first region R1 in the X-axis direction, so that the first region R1 is more subjected to tensile deformation than the other areas. Concurrently, when the first section F1 is bent, compressive stress is applied to the second region R2 in the X-axis direction, so that the second region R2 is more subjected to compressive deformation than the other areas. Thus, in the insulating base material 10C, the first section F1 is even bent more easily than the second sections F2A and F2B.

Further, in the present preferred embodiment, preferably, each of the resin layers 11c and 13c includes the photo-oriented polymer, but the resin layers 12c does not include the photo-oriented polymer. Typically, a resin including a photo-oriented polymer has a greater dielectric constant than a resin including no photo-oriented polymer. Thus, in the present preferred embodiment, the third region R3 (i.e., the resin layer 12c) has a dielectric constant ($\varepsilon 3$) smaller than a dielectric constant ($\varepsilon 1$) of the first region R1 (i.e., the resin layer 13c) and smaller than a dielectric constant ($\varepsilon 2$) of the second region R2 (i.e., the resin layer 11c), in other words, $\varepsilon 3 < \varepsilon 1$, and $\varepsilon 3 < \varepsilon 2$.

In the present preferred embodiment, as shown in FIG. 12B, for example, at least a portion of each of the signal lines 41 and 42 is located in (is in contact with) the third region R3 that has excellent high-frequency characteristics (i.e., has a small dielectric loss tangent tan $\delta$). Thus, the resin substrate has an improved high-frequency characteristic. Further, with this configuration, compared with an insulating base material including only a plurality of resin layers including the photo-oriented polymer, the resin substrate 103 has less conductor loss in circuits or the resin substrate 103 (i.e., the insulating base material 10C) is reduced in thickness. More specifically, in the insulating base material 10C, a linear width of each of the conductor patterns is increased, thus reducing the conductor loss in the circuit. Further, when the resin substrate includes a circuit having a predetermined characteristic, it is possible, without reducing the linear widths of the conductor patterns, to reduce a width of each of the resin layers, thus reducing the thickness of the insulating base material 10C.

As has been described in the present preferred embodiment, at least a portion of the ground conductor 51 and at least a portion of the ground conductor 52 may be respectively provided in the first region R1 and the second region R2 both of which have a greater dielectric constant. Each of the ground conductors is not configured to transmit a high-frequency signal. Thus, even when the corresponding ground conductor is provided in a region having a greater dielectric constant, an influence on the high-frequency characteristic of the resin substrate is limited, compared with a case where each of the signal lines is provided in the region with a greater dielectric constant.

As has been described in the present preferred embodiment, an insulating base material may include a plurality of resin layers, not all of which include a photo-oriented polymer. A resin substrate according to preferred embodiments of the present invention may include an insulating base material including a plurality of resin layers, only some of which include the photo-oriented polymer.

Fourth Preferred Embodiment

In a fourth preferred embodiment of the present invention, an example of a resin substrate, where a degree of resin molecular orientation in a Y-axis direction continuously changes (or gradually decreases) from a first main surface toward a second main surface, will be described.

Figure 14A:
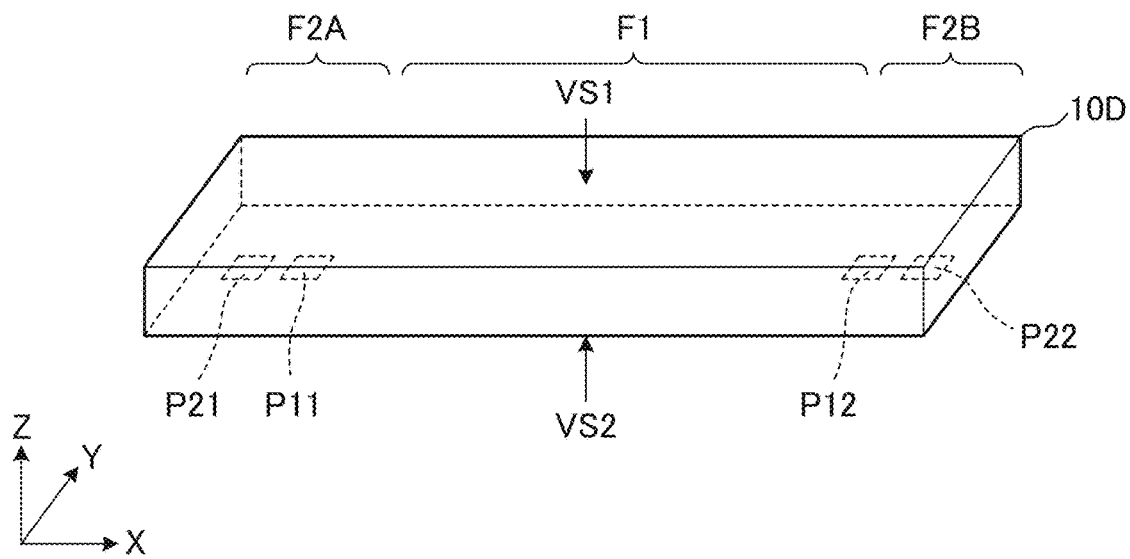
FIG. 14A is an external perspective view of a resin substrate 104 according to a fourth preferred embodiment of the present invention.
Figure 14B:
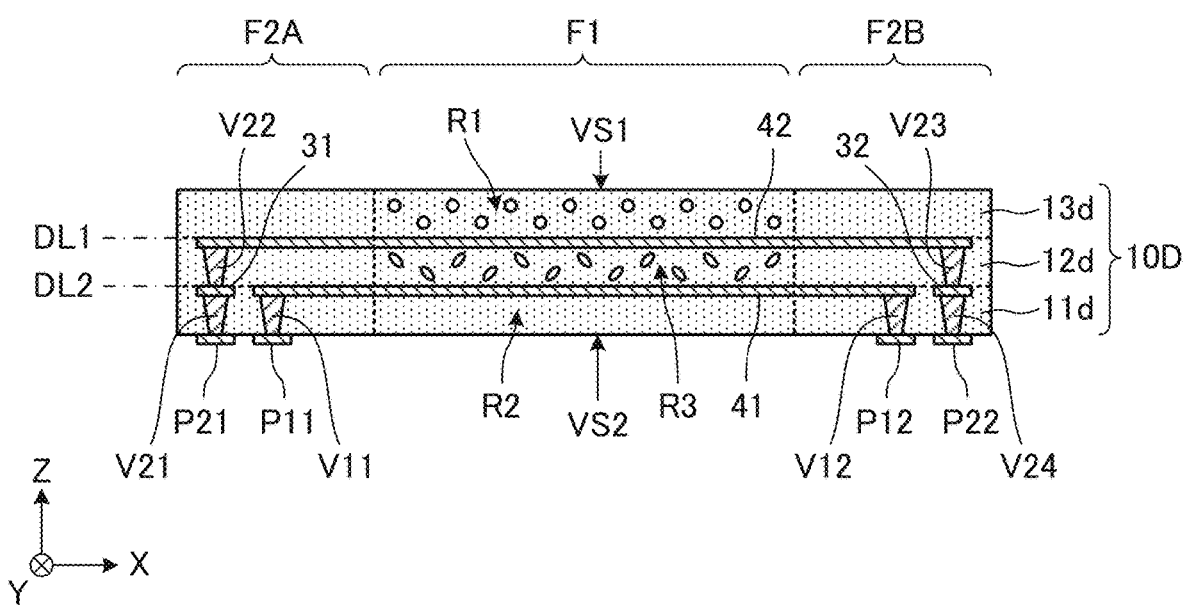
FIG. 14B is a cross-sectional view of the resin substrate 104.

FIG. 14A is an external perspective view of a resin substrate 104 according to a fourth preferred embodiment, and FIG. 14B is a cross-sectional view of the resin substrate 104. FIG. 15 is an exploded plan view of the resin substrate 104. In FIG. 15, for ease of understanding of the structure, each of a signal line 41 and a signal line 42 is shown with a dot pattern.

Unlike the resin substrate 101 according to the first preferred embodiment, the resin substrate 104 includes an insulating base material 10D and two signal lines, i.e., the signal line 41 and the signal line 42. Further, unlike the resin substrate 101, the resin substrate 104 does not include a protective layer. Other configurations of the resin substrate 104 are the same or substantially the same as those of the resin substrate 101.

The resin substrate 103 is different from the resin substrate 101 according to the first preferred embodiment, as described below.

The insulating base material 10D includes a plurality of resin layers. i.e., a resin layer 11d, a resin layer 12d, and a resin layer 13d, each made of a resin (for example, thermosetting resin). The resin layers 11d, 12d, and 13d are laminated in this sequential order to define the insulating base material 10D. Each of the resin layers 11d, 12d, and 13d is preferably, for example, a resin sheet including a photo-oriented polymer, in addition to an epoxy resin (EP).

The resin layer 11d includes, on its rear surface, a mounting electrode P11, a mounting electrode P12, a mounting electrode P21, and a mounting electrode P22. Each of the mounting electrodes P11 and P21 is a conductor pattern have a rectangular or substantially rectangular shape and provided adjacent to or in the vicinity of a first end of the resin layer 11d (i.e., a left end of the resin layer 11d in FIG. 15). The mounting electrodes P11 and P12 are arranged in an X-axis direction. Each of the mounting electrodes P12 and P22 is a conductor pattern having a rectangular or substantially rectangular shape and provided adjacent to or in the vicinity of a second end of the resin layer 11d (i.e., a right end of the resin layer 11d in FIG. 15). Concurrently, the resin layer 11d includes interlayer connection conductors V11, V12, V21, and V24 thereon.

The resin layer 12d includes, on its rear surface, the signal line 41, a conductor 31, and a conductor 32. The signal line 41 is a conductor pattern having a linear shape and extends in a transmission direction (i.e., the X-axis direction). The conductor 31 is a conductor pattern having a rectangular or substantially rectangular shape and provided adjacent to or in the vicinity of a first end of the resin layer 12d (i.e., a left end of the resin layer 12d in FIG. 15). The conductor 32 is a conductor pattern having a rectangular or substantially rectangular shape and provided adjacent to or in the vicinity of a second end of the resin layer 12d (a right end of the resin layer 12d in FIG. 15). Each of the conductors 31 and 32 is preferably a Cu foil, for example. Concurrently, the resin layer 12d includes an interlayer connection conductor V22 and an interlayer connection conductor V23 thereon.

The resin layer 13d includes, on its rear surface, the signal line 42. The signal line 42 is a conductor pattern having a linear shape and extends in a transmission direction (i.e., the X-axis direction).

A protective layer 1 is a protective film laminated on the rear surface of the resin layer 11c, and has the same or substantially the same planar shape as the resin layer 11c. The protective layer 1 includes an opening OP11, an opening OP12, an opening OP21, and an opening OP22 that are respectively positioned in correspondence to the mounting electrode P11, the mounting electrode P12, the mounting electrode P21, and the mounting electrode P22. With this configuration, even when the protective layer 1 is provided on the rear surface of the resin layer 11c (i.e., a second main surface VS2 of the insulating base material 10D), the mounting electrodes P11, P12, P21, and P22 are respectively externally exposed from the openings OP11, OP12, OP21, and OP22. Concurrently, the protective layer 1 includes openings OG1 and openings OG2, each provided in plural number and positioned in correspondence to the ground conductor 51. With this configuration, even when the protective layer 1 is provided on the rear surface of the resin layer 11c, a portion of the ground conductor 51 is externally exposed from each of the openings OG1 and OG2. In the present preferred embodiment, the portion of the ground conductor 51 exposed from the opening OG1 corresponds to each of the "ground electrodes PG1", and the portion of the ground conductor 51 exposed from the opening OG2 corresponds to each of the "ground electrodes PG2".

The protective layer 2 is a protective film laminated on the surface of the resin layer 13c, and has the same or substantially the same planar shape as the resin layer 13c.

As shown in FIG. 14B, a first region R1 has a greater degree of resin molecular orientation in the Y-axis direction than the other areas (i.e., a second section F2A, a second section F2B, a second region R2, and a third region R3). Particularly, the first region R1 has a greater degree of resin molecular orientation in the Y-axis direction than the second sections F2A and F2B. Concurrently, the third region R3 has a greater degree of resin molecular orientation in the Y-axis direction than the other areas (i.e., the second section F2A, the second section F2B, and the second region R2). More specifically, in the insulating base material 10D, a first section F1 has continuous changes (or has a gradual decrease) in degree of resin molecular orientation in the Y-axis direction from a first main surface VS1 toward the second main surface VS2.

With this configuration, the resin substrate 104 achieves the same or substantially the same advantageous operations and effects as the resin substrate 101, that is, even when the first section F1 is bent, each of the second sections F2A and F2B is less prone to being deformed or bent.

Further, as has been described in the present preferred embodiment, the resin substrate 104 may not necessarily include the protective layer on the first main surface VS1 or the second main surface VS2 of the insulating base material.

Figure 16:
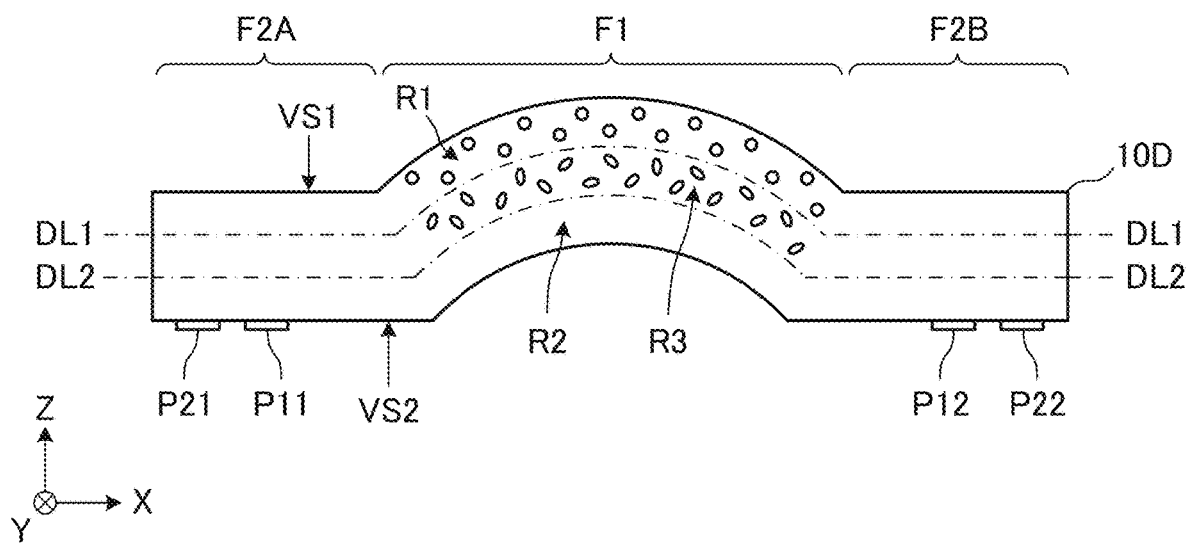
FIG. 16 is a front view of a resin substrate 104A where a first section F1 has been bent.

FIG. 16 is a front view of a resin substrate 104A where a first section F1 has been bent. As shown in FIG. 16, the resin substrate 104A includes an insulating base material 10D, and the insulating base material 10D includes a bent portion as the first section F1 that has been bent into a U shape.

In the resin substrate 104 according to the present preferred embodiment, the first section F1 has a gradual decrease in linear expansion coefficient in the X-axis direction from the first main surface VS1 toward to the second main surface VS2. With this configuration, when an entire or substantially the entire portion of the insulating base material 10D (or the first section F1 of the insulating base material 10D) is heated at a high temperature, due to the difference in linear expansion coefficient, the first section F1 is automatically deformed as shown in FIG. 16. In the present preferred embodiment, the insulating base material 10D is preferably, for example, a thermosetting resin element. Accordingly, when heated at the high temperature (that is higher than the temperature at which the resin layers are laminated), the insulating base material 10D is cured, so that the first section F1 is maintained bent.

The resin substrate 104 according to the present preferred embodiment is manufactured, for example, in steps described below. FIG. 17 is a cross-sectional view showing the steps for manufacturing the resin substrate 104 in a sequential order.

First, as shown in (1) of FIG. 17, the resin layers 11d, 12d, and 13d, each formed of the resin (thermoplastic resin), are prepared. Each of the resin layers 11d, 12d, and 13d is, for example, a resin sheet including a photo-oriented polymer in addition to a liquid crystal polymer (LCP) or a polyimide (PI).

Next, the mounting electrodes P11, P12, P21, and P22 are provided on the rear surface of the resin layer 11d, the signal line 41, the conductors 31 and 32 are provided on the rear surface of the resin layer 12d, and the signal line 42 is provided on the rear surface of the resin layer 13d. More specifically, a metal foil is laminated and patterned by photolithography on the rear surface of each of the resin layers 11d, 12d, and 13d. As a result, each of the mounting electrodes P11, P12, P21, and P22, each of the signal lines 41 and 42, and each of the conductors 31 and 32 is provided on the rear surface of a corresponding one of the resin layers 11d, 12d, and 13d.

Concurrently, the resin layer 11d includes the interlayer connection conductors V11, V12, V21, and V24 thereon, and the resin layer 12d includes the interlayer connection conductors V22 and V23 thereon. These interlayer connection conductors are provided, for example, as follows. Each of the resin layers includes a hole formed by laser irradiation, drilling, or the like, for example, the hole is filled with a conductive paste including a metal powder, e.g., Cu, Sn, or an alloy thereof, and a resin material, and the resin layers are to be heat-pressed such that the conductive paste is solidified.

Next, the plurality of resin layers, i.e., the resin layers 11d, 12d, and 13d, are laminated in this sequential order, and the resin layers 11d, 12d, and 13d are heat-pressed to form an insulating base material 10DP, as shown in (2) of FIG. 17.

A sequence of these steps to form the insulating base material 10DP corresponds to an example of a "second insulating base material formation step".

Subsequently, as shown in (2) of FIG. 17, an area that is to be the first region of the insulating base material is irradiated with light LC from the first main surface VS1, so that the resin molecules are oriented in the Y-axis direction. More specifically, the light LC is polarized in the Y-axis direction by a polarizing plate 4 to be light LY, and a predetermined area of the insulating base material 10DP is irradiated with the light LY (that has been polarized), so that the resin molecules in the predetermined area irradiated are oriented in the Y-axis direction.

With the steps described above, it is possible to form the insulating base material 10D where, due to a light intensity distribution or a temperature distribution, the degree of resin molecular orientation in the Y-axis direction gradually decreases as a distance from the area irradiated with the light LY increases. In other words, in the insulating base material 10D, the first section F1 has continuous changes (or has the gradual decrease) in degree of resin molecular orientation in the Y-axis direction from the first main surface VS1 toward the second main surface VS2. Concurrently, in the insulating base material 10D, the first section F1 has continuous changes (has a gradual decrease) in degree of resin molecular orientation in the Y-axis direction from an area near a center of the first section F1 in planar direction (e.g., the X-axis direction) toward the second section F2A and the second section F2B.

When the second insulating base material formation step has been completed, the area (that is to be the first region) is irradiated with light or laser from the first main surface VS1, so that the resin molecules in the first region are oriented in the Y-axis direction. A sequence of these steps corresponds to an example of a "third molecular orientation step".

With the manufacturing method described above, the plurality of resin layers, i.e., the resin layers 11d, 12d, and 13d, are laminated to form the insulating base material 10DP before the molecules are oriented in the insulating base material 10DP. Accordingly, compared with a case where resin molecules are oriented in each of the resin layers 11d, 12d, and 13d before being laminated to form the insulating base material, the manufacturing steps are simplified, thus keeping costs low. Note that, the present preferred embodiment provides the insulating base material 10DP where the resin molecules are oriented. However, the present invention is not limited thereto. As has been described in the first and the second preferred embodiments, the resin molecules may be oriented in each of the plurality of resin layers before being laminated such that a resin substrate having the following feature is formed. The degree of resin molecular orientation changes in a sequential order from the first region R1 through the third region R3 to the second region R2.

Note that, the present preferred embodiment provides an example of the resin substrate where the first section F1 has the continuous changes (gradual decrease) in degree of resin molecular orientation in the Y-axis direction from the first main surface VS1 toward the second main surface VS2. However, the present invention is not limited thereto. With a resin substrate according to a preferred embodiment of the present invention, for example, the first section F1 may have continuous changes (or have a gradual decrease) in degree of resin molecular orientation in the X-axis direction from the second main surface VS2 toward the first main surface VS1. It is possible to form a resin substrate of this type, for example, in steps described below. When the second insulating base material formation step has been completed, an area (that is to be the second region of the insulating base material) is irradiated with light polarized from the second main surface VS2, so that the resin molecules in the area are oriented in the X-axis direction. A sequence of these steps corresponds to an example of a "fourth molecular orientation step".

Fifth Preferred Embodiment

In a fifth preferred embodiment of the present invention, an example of a resin substrate which includes a third section and is bent into a crank shape, will be described.

Figure 18:
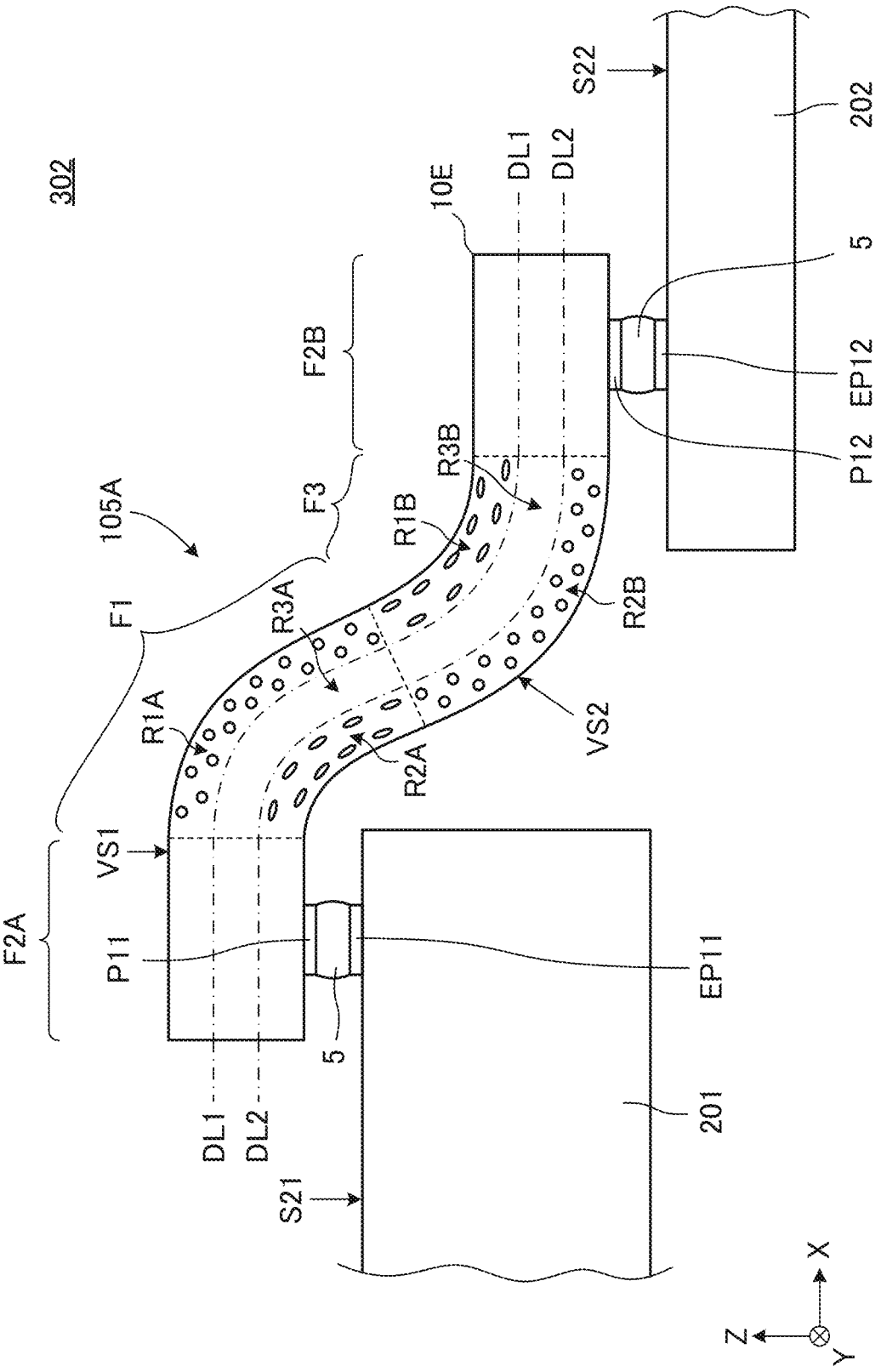
FIG. 18 is a front view showing a main part of an electronic device 302 according to a fifth preferred embodiment of the present invention.

FIG. 18 is a front view showing a main portion of an electronic device 302 according to the fifth preferred embodiment.

The electronic device 302 includes a resin substrate 105A, a circuit board 201, and a circuit board 202. The circuit boards 201 and 202 respectively have the same or substantially the same configurations as those of the circuit boards 201 and 202 described in the first preferred embodiment. The circuit board 201 includes a first surface S21, and the circuit board 202 includes a second surface S22. The first surface S21 and the second surface S22 are positioned parallel or substantially parallel to an X-Y plane and at different heights from each other in a Z-axis direction.

The resin substrate 105A includes an insulating base material 10E that is divided into a first section F1, a second section F2A, a second section F2B, and a third section F3. Each of the first section F1 and the third section F3 is subjected to bending. In the insulating base material 10E, the second section F2A, the first section F1, the third section F3, and the second section F2B are arranged in this sequential order.

With each of the first section F1 and the third section F3 bent, the resin substrate 105A is mounted on the circuit boards 201 and 202. More specifically, the resin substrate 105A includes a mounting electrode P11 that is to be connected to an external electrode EP11 of the circuit board 201 with a conductive bonding material 5. The resin substrate 105A includes a mounting electrode P12 that is to be connected to an external electrode EP12 of the circuit board 202 with the conductive bonding material 5. While not shown, the resin substrate 105A further includes a ground electrode that is to be connected to a ground electrode of each of the circuit boards 201 and 202 with the conductive bonding material 5.

As shown in FIG. 18, the first section F1 includes a first region R1A, a second region R2A, and a third region R3A. The third section F3 includes a first region R1B, a second region R2B, and a third region R3B. When the third section F3 is evenly divided into three in the Z-axis direction, the first region R1B is positioned closest to a first main surface VS1. When the third section F3 is evenly divided into three in the Z-axis direction, the second region R2B is positioned closest to a second main surface VS2, and the third region R3B is located between the first region R1B and the second region R2B.

In the resin substrate 105A, the first section F1 includes the first region R1A where resin molecules are oriented in a Y-axis direction, and the third section F3 includes the second region R2B where the resin molecules are oriented in the Y-axis direction. Concurrently, in the resin substrate 105A, the first section F1 includes the second region R2A where the resin molecules are oriented in an X-axis direction, and the third section F3 includes the first region R1B where the resin molecules are oriented in the X-axis direction. With this configuration, in contrast to the first section F1, the third section F3 includes the second region R2B that has a greater degree of resin molecular orientation in the Y-axis direction than the second sections F2A and F2B. Concurrently, in contrast to the first section F1, the third section F3 includes the first region R1B that has a greater degree of resin molecular orientation in the X-axis direction than the second sections F2A and F2B. In other words, the first section F1 and the third section F3 have the resin molecular orientations that are reverse to each other from the first regions toward the second regions (i.e., from the first main surface VS1 toward the second main surface VS2).

As shown in FIG. 18, the first section F1 of the resin substrate 105A is bent such that the first region R1A is tension-deformed and the second region R2A is compressively deformed. In other words, the first section F1 is bent outward (i.e., having the second main surface VS2 positioned at an inner peripheral side), as shown in FIG. 18. Concurrently, the third section F3 of the resin substrate 105A is bent such that the second region R2B is tension-deformed and the first region R1B is compressively deformed. In other words, the third section F3 is bent inward (i.e., having the first main surface VS1 positioned at the inner peripheral side), as shown in FIG. 18. With this configuration, the resin substrate 105A is bent into a crank shape.

As has been described in the present preferred embodiment, when the resin substrate includes a portion that is to be bent in a direction reverse to that of the first section F1, the resin substrate may further include the third section F3. Further, when the insulating base material has been bent, the shape thereof is not limited to an L-shape or the crank shape, and the shape may be changed or modified as appropriate within the technical range of the present invention.

Note that, in the present preferred embodiment, the third section F3 includes the first region R1B that has a greater degree of resin molecular orientation in the X-axis direction, and includes the second region R2B that has a greater degree of resin molecular orientation in the Y-axis direction. However, the present invention is not limited thereto. In other words, the third section F3 includes the first region R1B where the resin molecules are oriented in the X-axis direction, and includes the second region R2B where the resin molecules are oriented in the Y-axis direction. However, the present invention is not limited thereto. In the third section F3, from the first region to the second region, the resin molecular orientation may be in a reverse order of the resin molecular orientation in the first section F1 (that has been described in each of the first, second, third, and fourth preferred embodiments). Alternatively, the first section F1 of the present preferred embodiment may be replaced with, for example, the first section F1 that has been described in each of the first to fourth preferred embodiments.

Other Preferred Embodiments

In each of the foregoing preferred embodiments of the present invention, the resin substrate corresponds to a cable to connect two circuit boards, but the present invention is not limited thereto. A resin substrate according to a preferred embodiment of the present invention may be, for example, an electronic component that is to be surface-mounted to a single circuit board. Alternatively, in the resin substrate, a second section (as a connector section) may include a connector as needed.

In each of the foregoing preferred embodiments, the insulating base material preferably has a cuboid shape, with its longitudinal direction aligned with the X-axis direction. However, the shape is not limited thereto. The shape of the insulating base material may be changed or modified as appropriate within the technical range of the present invention, and may have the longitudinal direction not necessarily aligned with the X-axis direction. For example, the insulating base material may have an L-shape, a U-shape, a crank shape, a T-shape, or a Y-shape planar shape.

In each of the foregoing preferred embodiments, the insulating base material is divided into the second section, the first section, and the second section in this sequential order (or the insulating base material is divided into the second section, the first section, the third section, and the second section in this sequential order). However, an insulating base material according to preferred embodiments of the present invention is not limited thereto. In the insulating base material, the number of each of the first section, the second section, and the third section may be changed or modified as appropriate within the technical range of the present invention. The insulating base material may be divided into, for example, the second section, the first section, the second section, the first section, and the second section in this sequential order.

In each of the foregoing preferred embodiments, the insulating base material includes the three resin layers laminated on each other. However, an insulating base material according to a preferred embodiment the present invention is not limited thereto. In the insulating base material, the number of the resin layers may be changed or modified as appropriate within the technical range of the present invention. The insulating base material may include, for example, a single, two, four or more resin layer(s). In other words, in the insulating base material, the three resin layers may not necessarily correspond respectively to the first region, the second region, and the third region. In each of the foregoing preferred embodiments, in the insulating base material, the plurality of resin layers have the same or substantially the same thickness. However, the thickness of each of the resin layers may be different from the other(s). Note that, in preferred embodiments of the present invention, the degree of resin molecular orientation in each of the regions (i.e., the first region, the second region, and the third region) corresponds to a degree of resin molecular orientation in an entire or substantially and entire portion of the corresponding region, and corresponds not to a degree of resin molecular orientation in only a portion of the corresponding region (e.g., a specific resin layer of the plurality of resin layers).

In each of the foregoing preferred embodiments, the insulating base material is a thermoplastic resin element. However, an insulating base material is not limited thereto. The insulating base material may be a thermosetting resin element, for example. Further, as has been described in the third preferred embodiment, the insulating base material may be a laminated composite including a plurality of resin layers. In the insulating base material, the plurality of resin layers may not necessarily be heat-pressed (i.e., collectively pressed) to be surface attached to each other. The plurality of resin layers may alternatively have an adhesive layer therebetween.

The circuit configurations on the resin substrate in each of the foregoing preferred embodiments are not restrictive, but may be changed or modified as appropriate within the technical range of the present invention. The resin substrate may include a circuit including, for example, a conductor pattern coil, a capacitor including a conductor pattern, or a frequency filter such as various filters (e.g., a low pass filter, a high pass filter, a band pass filter, or a band elimination filter). Alternatively, the resin substrate may include various other transmission lines (e.g., a microstrip line or a coplanar line). Still alternatively, the resin substrate may have various electronic components, e.g., a chip component, mounted thereon or embedded therein.

In each of the foregoing preferred embodiments, the resin substrate includes one or two transmission line(s). However, the present invention is not limited thereto. The number of transmission lines may be changed or modified as appropriate by circuit configuration on the resin substrate.

In each of the foregoing preferred embodiments, the insulating base material includes the mounting electrodes having a rectangular or substantially rectangular shape on the second main surface VS2. However, the mounting electrodes are not limited thereto. Each of the mounting electrodes may have the shape, the number, and the position thereof changed or modified as appropriate within the technical range of the present invention. Each of the mounting electrodes may have the planar shape may be, for example, a polygonal shape, a circular shape, an elliptical shape, a circular-arc shape, a ring shape an L-shape, a U-shape, a T-shape, a Y-shape, a crank shape, or others. Further, the insulating base material may include the mounting electrodes on each of the first main surface VS1 and the second main surface VS2. The dielectric constant ($\epsilon 3$) may be smaller than at least one of the dielectric constant ($\epsilon 1$) and the dielectric constant ($\epsilon 2$). At least one of the first main surface VS1 and the second main surface VS2 may be a surface parallel or substantially parallel to the X-axis direction and a Y-axis direction.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A resin substrate comprising:
an insulating base material including a first main surface and a second main surface at least one of which is parallel or substantially parallel to each of an X-axis direction and a Y-axis direction in an X-Y-Z orthogonal coordinate system, the first main surface and the second main surface opposing each other; wherein
the insulating base material includes at least one resin layer including a liquid crystal polymer (LCP);
the insulating base material is divided into a first section and a second section each of which is arranged in the X-axis direction;
the first section includes, when evenly divided into three in a Z-axis direction, a first region closest to the first main surface, a second region closest to the second main surface, and a third region between the first region and the second region;

a degree of resin molecular orientation in the first region in the Y-axis direction is greater than a degree of resin molecular orientation in the second section of the insulating base material in the Y-axis direction; and the degree of resin molecular orientation in the first region in the Y-axis direction is greater than a degree of resin molecular orientation in the first region in the X-axis direction.

2. The resin substrate according to claim 1, wherein a degree of resin molecular orientation in the third region in the Y-axis direction is greater than the degree of resin molecular orientation in the second section of the insulating base material in the Y-axis direction.

3. The resin substrate according to claim 2, wherein
the degree of resin molecular orientation in the first region in the Y-axis direction is greater than each of a degree of resin molecular orientation in the second region in the Y-axis direction and the degree of resin molecular orientation in the third region in the Y-axis direction; and the degree of resin molecular orientation in the third region in the Y-axis direction is greater than the degree of resin molecular orientation in the second region in the Y-axis direction.

4. The resin substrate according to claim 1, wherein a degree of resin molecular orientation in the second region in the X-axis direction is greater than a degree of resin molecular orientation in the second section of the insulating base material in the X-axis direction.

5. A resin substrate comprising:
an insulating base material including a first main surface and a second main surface at least one of which is parallel or substantially parallel to each of an X-axis direction and a Y-axis direction in an X-Y-Z orthogonal coordinate system, the first main surface and the second main surface opposing each other; wherein the insulating base material is divided into a first section and a second section each of which is arranged in the X-axis direction;

the first section includes, when evenly divided into three in a Z-axis direction, a first region closest to the first main surface, a second region closest to the second main surface, and a third region between the first region and the second region; and a degree of resin molecular orientation in the second region in the X-axis direction is greater than a degree of resin molecular orientation in the second section of the insulating base material in in the X-axis direction.

6. The resin substrate according to claim 4, wherein a degree of resin molecular orientation in the third region in the X-axis direction is greater than the degree of resin molecular orientation in the second section of the insulating base material in the X-axis direction.

7. The resin substrate according to claim 6, wherein
the degree of resin molecular orientation in the second region in the X-axis direction is greater than each of the degree of resin molecular orientation in the first region in the X-axis direction and the degree of resin molecular orientation in the third region in the X-axis direction; and the degree of resin molecular orientation in the third region in the X-axis direction is greater than the degree of resin molecular orientation in the first region in the X-axis direction.

8. The resin substrate according to claim 1, wherein the insulating base material includes a bent portion in the first section, the bent portion being bent in the Z-axis direction.

9. The resin substrate according to claim 1, wherein in the second section, a degree of resin molecular orientation in the X-axis direction and the degree of resin molecular orientation in the Y-axis direction are isotropic.

10. The resin substrate according to claim 9, further comprising a mounting electrode in the second section.

11. The resin substrate according to claim 9, further comprising an interlayer connection conductor in the second section.

12. The resin substrate according to claim 1, wherein the insulating base material includes a photo-oriented polymer.

13. The resin substrate according to claim 1, wherein the insulating base material includes a plurality of the resin layers, each made of a thermoplastic resin and including the liquid crystal polymer (LCP), and the plurality of resin layers are laminated on each other.

14. The resin substrate according to claim 13, wherein a dielectric constant of the third region is smaller than at least one of a dielectric constant of the first region and a dielectric constant of the second region.

15. The resin substrate according to claim 14, further comprising:
a signal line in or on the insulating base material; wherein
at least a portion of the signal line is in the third region.

16. The resin substrate according to claim 14, further comprising:
a ground conductor on the insulating base material; wherein
at least a portion of the ground conductor is in at least one of the first region and the second region.

17. A resin substrate comprising:
an insulating base material including a first main surface and a second main surface at least one of which is parallel or substantially parallel to each of an X-axis direction and a Y-axis direction in an X-Y-Z orthogonal coordinate system, the first main surface and the second main surface opposing each other; wherein the insulating base material is divided into a first section and a second section each of which is arranged in the X-axis direction;

the first section includes, when evenly divided into three in a Z-axis direction, a first region closest to the first main surface, a second region closest to the second main surface, and a third region between the first region and the second region;

a Young's modulus in the first region in the Y-axis direction is greater than a Young's modulus in the second section in the Y-axis direction; and a Young's modulus in the first region in the X-axis direction is smaller than a Young's modulus in the second section in the X-axis direction.

18. A resin substrate comprising:
an insulating base material including a first main surface and a second main surface at least one of which is parallel or substantially parallel to each of an X-axis direction and a Y-axis direction in an X-Y-Z orthogonal coordinate system, the first main surface and the second main surface opposing each other; wherein the insulating base material is divided into a first section and a second section each of which is arranged in the X-axis direction;

the first section includes, when evenly divided into three in a Z-axis direction, a first region closest to the first main surface, a second region positioned to the second main surface, and a third region between the first region and the second region;

a Young's modulus in the second region in the X-axis direction is greater than a Young's modulus in the second section in the X-axis direction; and a Young's modulus in the second region in the Y-axis direction is smaller than a Young's modulus in the second section in the Y-axis direction.

19. The resin substrate according to claim 17, wherein the insulating base material includes a bent portion in the first section, and the bent portion is bent in the Z-axis direction.

20. A resin substrate comprising:
an insulating base material including a first main surface and a second main surface at least one of which is parallel or substantially parallel to each of an X-axis direction and a Y-axis direction in an X-Y-Z orthogonal coordinate system, the first main surface and the second main surface opposing each other; wherein the insulating base material is divided into a first section, a second section, and a third section each of which is arranged in the X-axis direction;

the first section includes, when evenly divided into three in a Z-axis direction, a first region closest to the first main surface, a second region closest to the second main surface, and a third region between the first region and the second region;

the third section includes, when evenly divided into three in the Z-axis direction, a first region closest to the first main surface, a second region closest to the second main surface, and a third region between the first region and the second region;

a degree of resin molecular orientation in the first region of the first section in the Y-axis direction is greater than a degree of resin molecular orientation in the second section of the insulating base material in the Y-axis direction; and a degree of resin molecular orientation in the second region of the third section in the Y-axis direction is greater than the degree of resin molecular orientation in the second section of the insulating base material in the Y-axis direction.

21. A resin substrate comprising:
an insulating base material including a first main surface and a second main surface at least one of which is parallel or substantially parallel to each of an X-axis direction and a Y-axis direction in an X-Y-Z orthogonal coordinate system, the first main surface and the second main surface opposing each other; wherein the insulating base material is divided into a first section, a second section, and a third section each of which is arranged in the X-axis direction;

the first section includes, when evenly divided into three in a Z-axis direction, a first region closest to the first main surface, a second region closest to the second main surface, and a third region between the first region and the second region;

the third section includes, when evenly divided into three in the Z-axis direction, a first region closest to the first main surface, a second region closest to the second main surface, and a third region between the first region and the second region;

a degree of resin molecular orientation in the second region of the first section in the X-axis direction is greater than a degree of resin molecular orientation in the second section of the insulating base material in the X-axis direction; and a degree of resin molecular orientation in the first region of the third section in the X-axis direction is greater than the degree of resin molecular orientation in the second section of the insulating base material in the X-axis direction.

22. A method for manufacturing a resin substrate including an insulating base material including a first main surface and a second main surface at least one of which is parallel or substantially parallel to each of an X-axis direction and a Y-axis direction in an X-Y-Z orthogonal coordinate system, the first main surface and the second main surface opposing each other, wherein the insulating base material is divided into a first section and a second section each of which is arranged in the X-axis direction, and the first section includes, when evenly divided into three in a Z-axis direction, a first region closest to the first main surface, a second region closest to the second main surface, and a third region between the first region and the second region, the method comprising:

a first molecular orientation step of irradiating a portion in a resin layer, the portion to be the first region of the insulating base material, with a light beam or a laser beam, in order to orient resin molecules of the portion in the Y-axis direction; and a first insulating base material formation step of, when the first molecular orientation step has been completed, laminating a plurality of resin layers including the resin layer where the resin molecules of the portion have been oriented in the Y-axis direction, and heat-pressing the plurality of resin layers, in order to form the insulating base material, and in order to cause a degree of resin molecular orientation in the first region in the Y-axis direction to be greater than a degree of resin molecular orientation in the second section of the insulating base material in the Y-axis direction.

23. The method according to claim 22, wherein
the resin layer includes a photo-oriented polymer; and
the first molecular orientation step includes a step of irradiating the resin layer including the portion to be the first region with a light beam polarized in the Y-axis direction.

24. A method for manufacturing a resin substrate including an insulating base material including a first main surface and a second main surface at least one of which is parallel or substantially parallel to each of an X-axis direction and a Y-axis direction in an X-Y-Z orthogonal coordinate system, the first main surface and the second main surface opposing each other, wherein the insulating base material is divided into a first section and a second section each of which is arranged in the X-axis direction, and the first section includes, when evenly divided into three in a Z-axis direction, a first region closest to the first main surface, a second region closest to the second main surface, and a third region between the first region and the second region, the method comprising:

a second molecular orientation step of irradiating a portion in a resin layer, the portion to be the second region of the insulating base material, with a light beam or a laser beam, in order to orient resin molecules of the portion in the X-axis direction; and a first insulating base material formation step of, when the second molecular orientation step has been completed, laminating a plurality of resin layers including the resin layer where the resin molecules of the portion have been oriented in the X-axis direction, and heat-pressing the plurality of resin layers, in order to form the insulating base material, and in order to cause a degree of resin molecular orientation in the second region in the X-axis direction to be greater than a degree of resin molecular orientation in the second section of the insulating base material in the X-axis direction.

25. The method according to claim 24, wherein the resin layer includes a photo-oriented polymer; and the second molecular orientation step includes a step of irradiating the resin layer including the portion to be the second region with a light beam polarized in the X-axis direction.

26. A method for manufacturing a resin substrate including an insulating base material including a first main surface and a second main surface at least one of which is parallel or substantially parallel to each of an X-axis direction and a Y-axis direction in an X-Y-Z orthogonal coordinate system, the first main surface and the second main surface opposing each other, wherein the insulating base material is divided into a first section and a second section each of which is arranged in the X-axis direction, and the first section includes, when evenly divided into three in a Z-axis direction, a first region closest to the first main surface, a second region closest to the second main surface, and a third region between the first region and the second region, the method comprising:

a second insulating base material formation step of forming the insulating base material; and a third molecular orientation step of, when the second insulating base material formation step has been completed, irradiating a portion to be the first region with a light beam or a laser beam from the first main surface, in order to cause a degree of resin molecular orientation in the first region in the Y-axis direction to be greater than a degree of resin molecular orientation in the second section of the insulating base material in the Y-axis direction.

27. The method according to claim 26, wherein the insulating base material includes a photo-oriented polymer; and the third molecular orientation step includes a step of irradiating the portion to be the first region of the insulating base material with a light beam polarized in the Y-axis direction.

28. A method for manufacturing a resin substrate including an insulating base material including a first main surface and a second main surface at least one of which is parallel or substantially parallel to each of an X-axis direction and a Y-axis direction in an X-Y-Z orthogonal coordinate system, the first main surface and the second main surface opposing each other, wherein the insulating base material divided into a first section and a second section each of which is arranged in the X-axis direction, and the first section including, when evenly divided into three in a Z-axis direction, a first region closest to the first main surface, a second region closest to the second main surface, and a third region between the first region and the second region, the method comprising:

a second insulating base material formation step of forming the insulating base material; and a fourth molecular orientation step of, when the second insulating base material formation step has been completed, irradiating a portion to be the second region with a light beam or a laser beam from the second main surface, in order to cause a degree of resin molecular orientation in the second region in the X-axis direction to be greater than a degree of resin molecular orientation in the second section of the insulating base material in the X-axis direction.

29. The method according to claim 28, wherein the insulating base material includes a photo-oriented polymer; and the fourth molecular orientation step includes a step of irradiating the portion to be the second region of the insulating base material with a light beam polarized in the X-axis direction.

* * * * *